(12) United States Patent
Caveney et al.

(10) Patent No.: US 8,826,532 B2
(45) Date of Patent: Sep. 9, 2014

(54) METHOD FOR REDUCING CROSSTALK IN ELECTRICAL CONNECTORS

(75) Inventors: Jack E. Caveney, North Palm Beach, FL (US); Masud Bolouri-Saransar, Orland Park, IL (US); Scott M. Lesniak, Lockport, IL (US)

(73) Assignee: Panduit Corp., Tinley Park, IL (US)

( * ) Notice: Subject to any disclaimer, the term of this patent is extended or adjusted under 35 U.S.C. 154(b) by 982 days.

(21) Appl. No.: 12/916,687

(22) Filed: Nov. 1, 2010

(65) Prior Publication Data

US 2011/0041331 A1 Feb. 24, 2011

Related U.S. Application Data

(63) Continuation of application No. 11/833,686, filed on Aug. 3, 2007, now Pat. No. 7,823,281, which is a continuation of application No. 11/078,816, filed on Mar. 11, 2005, now Pat. No. 7,252,554.

(60) Provisional application No. 60/552,995, filed on Mar. 12, 2004, provisional application No. 60/558,657, filed on Apr. 1, 2004.

(51) Int. Cl.
| | |
|---|---|
| H01R 43/00 | (2006.01) |
| H01R 13/6466 | (2011.01) |
| H05K 1/02 | (2006.01) |
| H01R 13/719 | (2011.01) |
| H01R 12/67 | (2011.01) |
| H01R 12/62 | (2011.01) |
| H01R 24/64 | (2011.01) |
| H01R 13/66 | (2006.01) |
| H01R 13/6467 | (2011.01) |
| H05K 1/18 | (2006.01) |
| H01R 12/59 | (2011.01) |

(52) U.S. Cl.
CPC .............. *H01R 12/675* (2013.01); *H01R 12/62* (2013.01); *H05K 2201/09245* (2013.01); *Y10S 439/941* (2013.01); *H01R 13/6466* (2013.01); *H01R 2201/04* (2013.01); *H05K 1/0228* (2013.01); *H01R 24/64* (2013.01); *H01R 13/6658* (2013.01); *H01R 13/6467* (2013.01); *H05K 2201/10189* (2013.01); *H05K 1/189* (2013.01); *H01R 12/592* (2013.01); *H01R 4/24363* (2013.01); *H01R 13/719* (2013.01)
USPC ................ 29/857; 29/842; 439/676; 439/941

(58) Field of Classification Search
USPC ............. 29/825, 842, 857; 439/607, 638, 676
See application file for complete search history.

(56) References Cited

U.S. PATENT DOCUMENTS

| | | | | |
|---|---|---|---|---|
| 5,299,956 | A * | 4/1994 | Brownell et al. | 439/638 |
| 6,057,743 | A * | 5/2000 | Aekins | 333/1 |
| 6,196,880 | B1 * | 3/2001 | Goodrich et al. | 439/676 |
| 6,533,618 | B1 * | 3/2003 | Aekins | 439/676 |
| 6,736,681 | B2 * | 5/2004 | Arnett | 439/676 |
| 2002/0019172 | A1 * | 2/2002 | Forbes et al. | 439/676 |
| 2003/0194908 | A1 * | 10/2003 | Brown et al. | 439/620 |
| 2004/0184247 | A1 * | 9/2004 | Adriaenssens et al. | 361/766 |

* cited by examiner

*Primary Examiner* — Carl Arbes
(74) *Attorney, Agent, or Firm* — Christopher S. Clancy; Christopher K. Marlow

(57) ABSTRACT

An apparatus and method for crosstalk compensation in a jack of a modular communications connector includes a flexible printed circuit board connected to jack contacts and to connections to a network cable. The flexible printed circuit board includes conductive traces arranged as one or more couplings to provide crosstalk compensation.

5 Claims, 33 Drawing Sheets

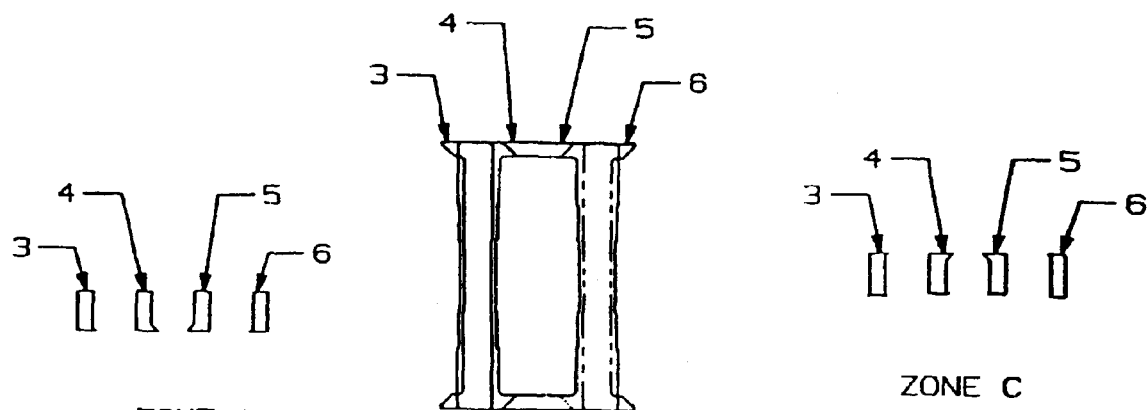
ZONE A
Fig.6a
ZONE B
Fig.6b
ZONE C
Fig.6c
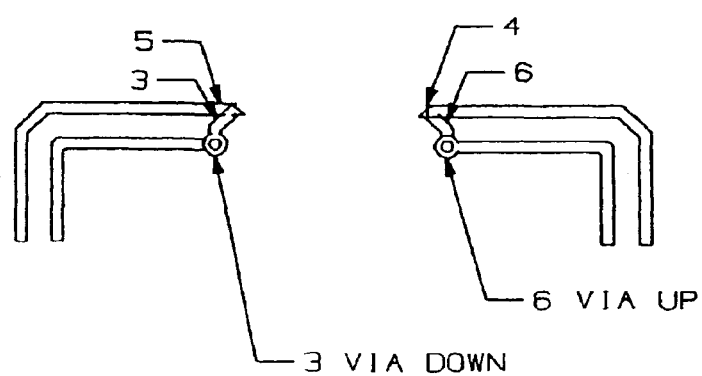
ZONE D
Fig.6d

ZONE E

ZONE F

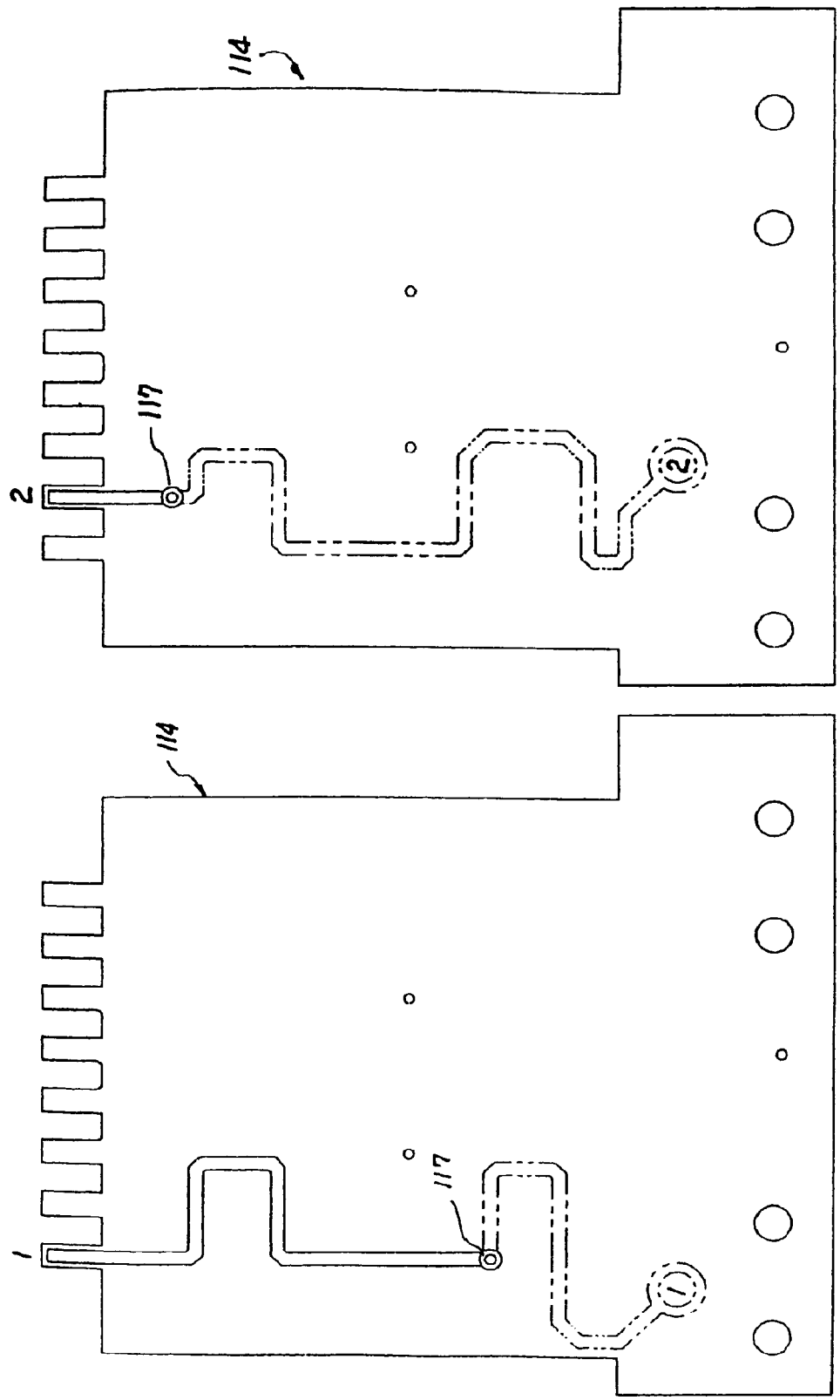

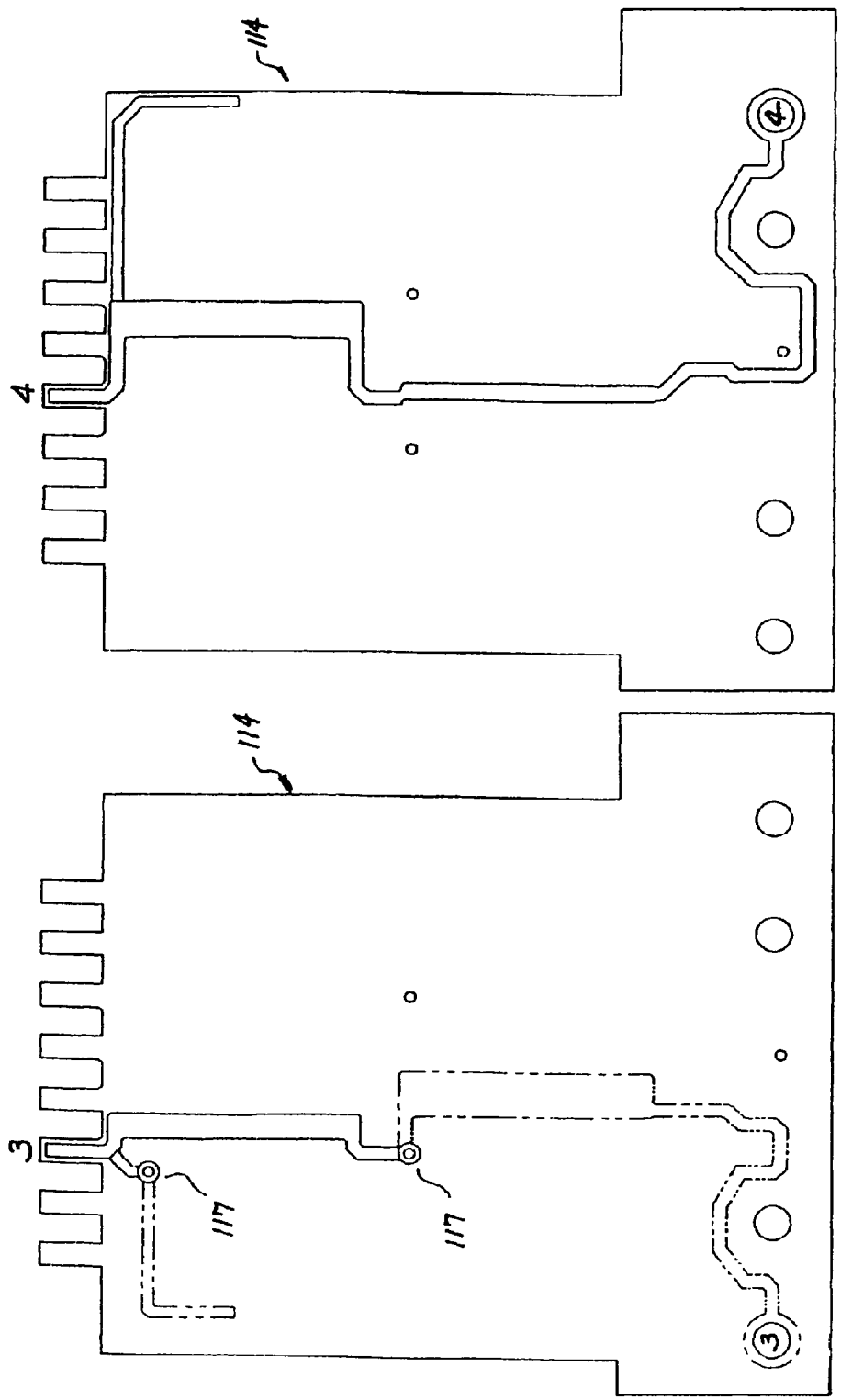

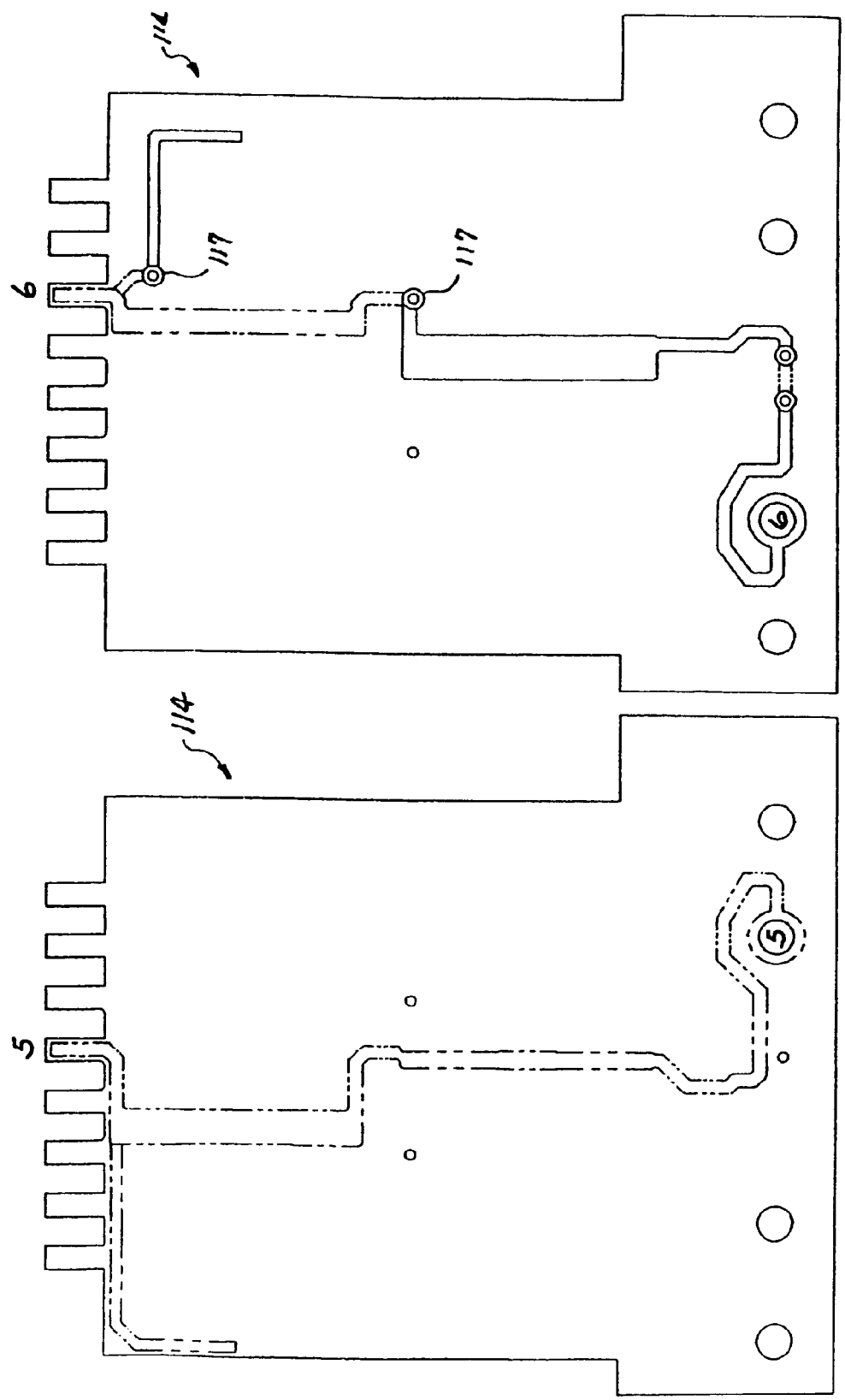

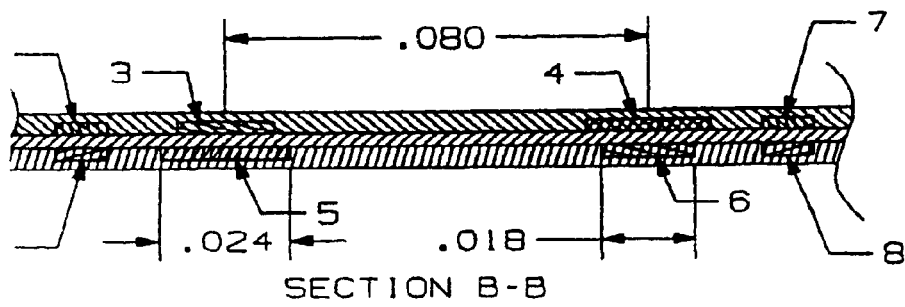
*Fig.8a*
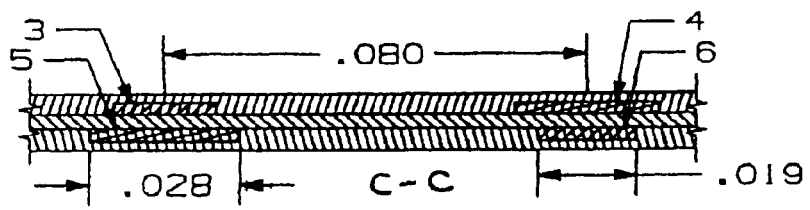
*Fig.8b*
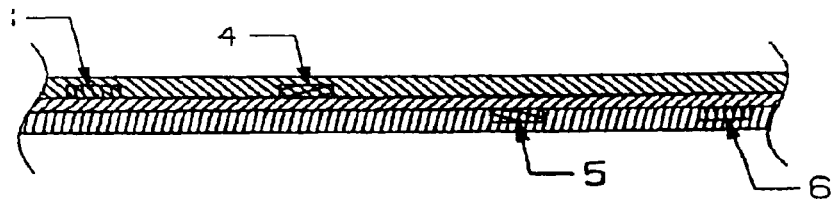
*Fig.9* SECTION D-D
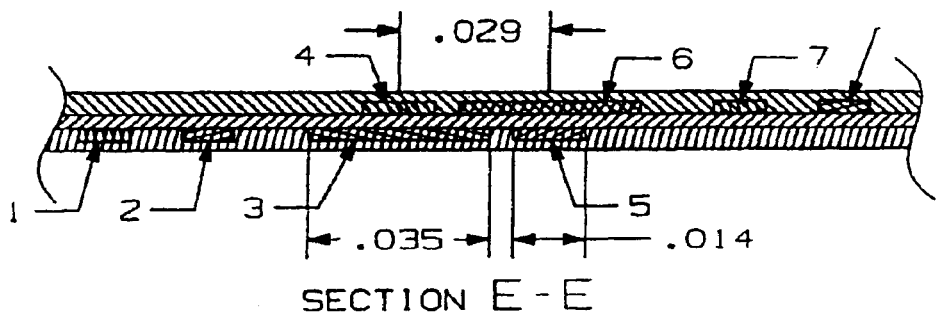
*Fig.10a*
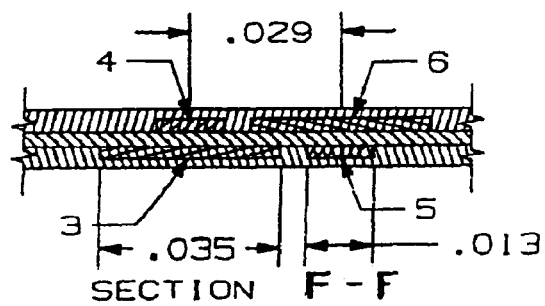
*Fig.10b*

SECTION G-G

SECTION H-H

SECTION I-I

DETAIL K

Zone C
DETAIL L

DETAIL M

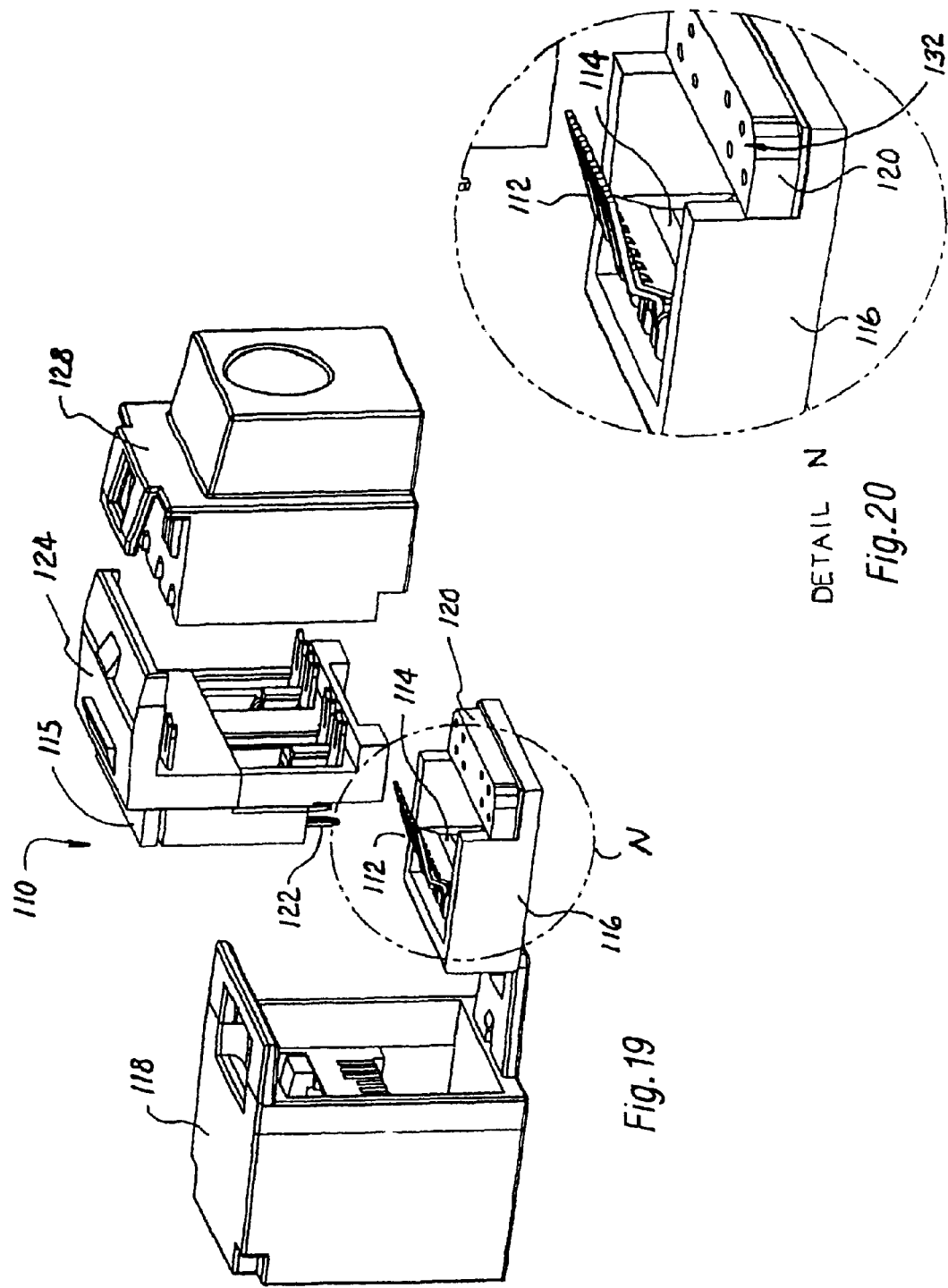

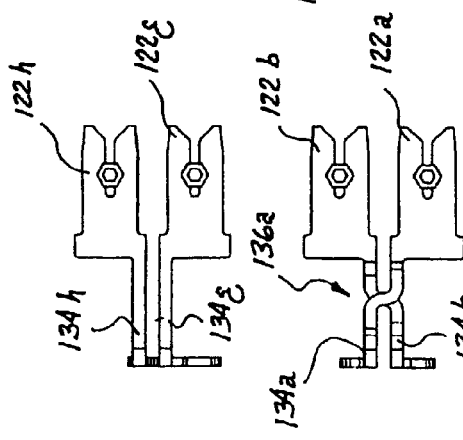
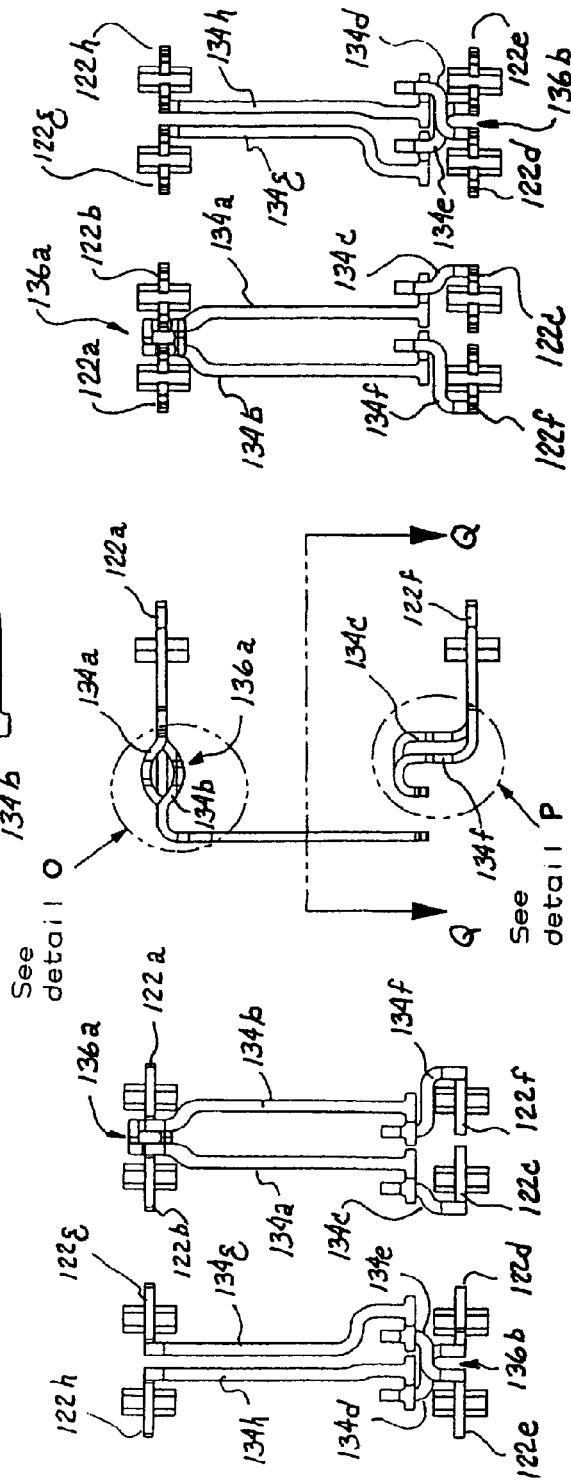
Fig.24
Fig.25
Fig.26
Fig.27

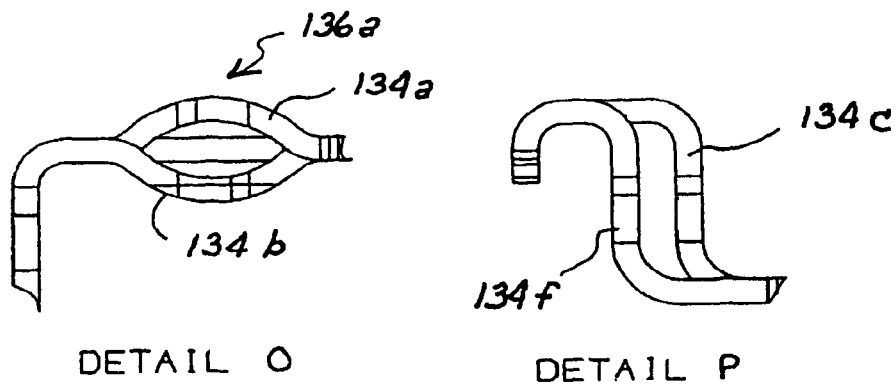
DETAIL O
*Fig.28*
DETAIL P
*Fig.29*
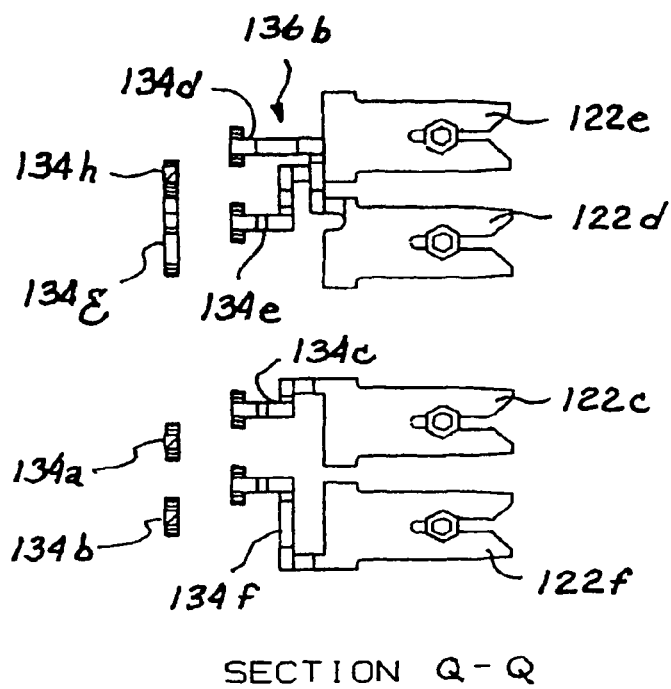
SECTION Q-Q
*Fig.30*

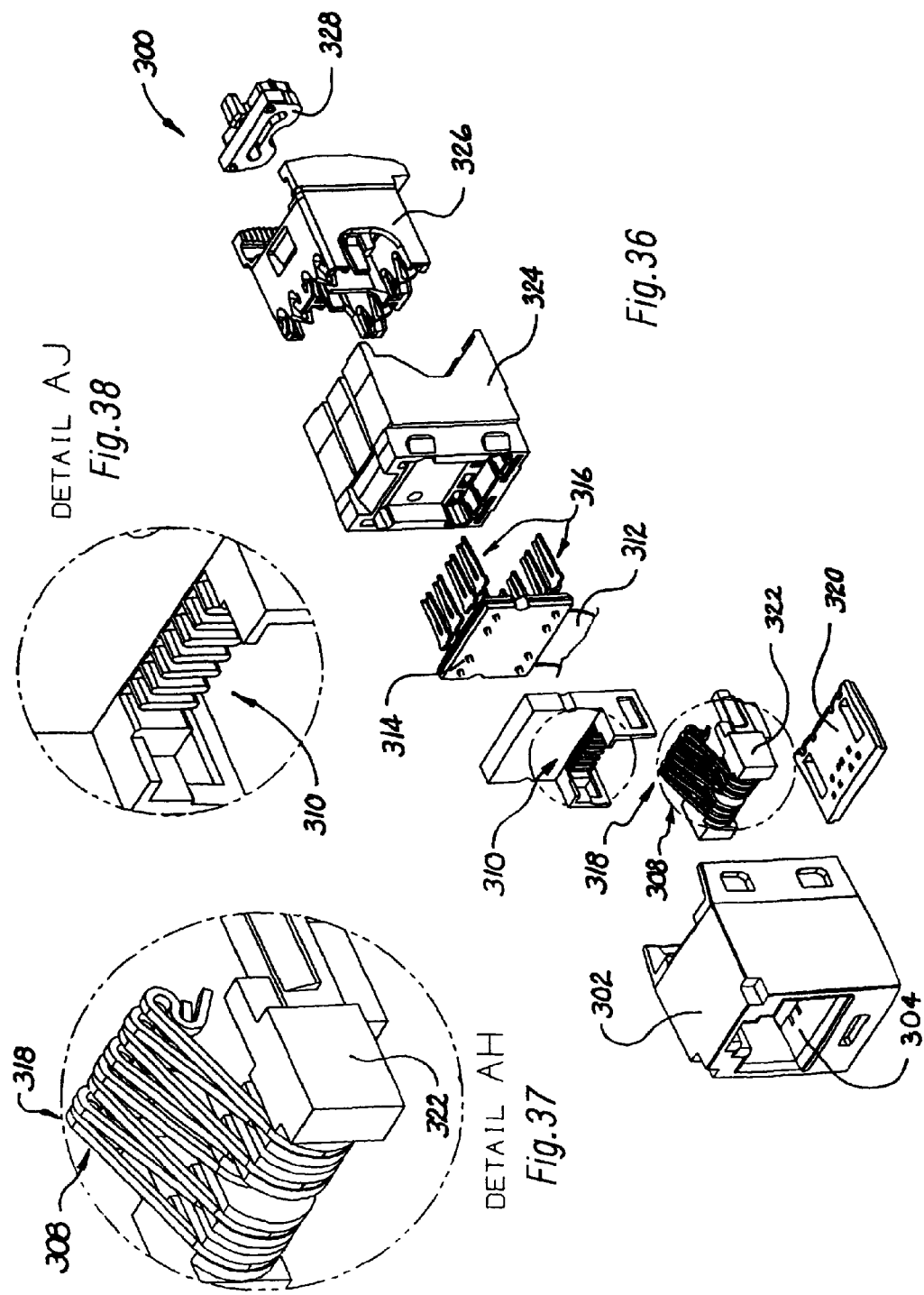

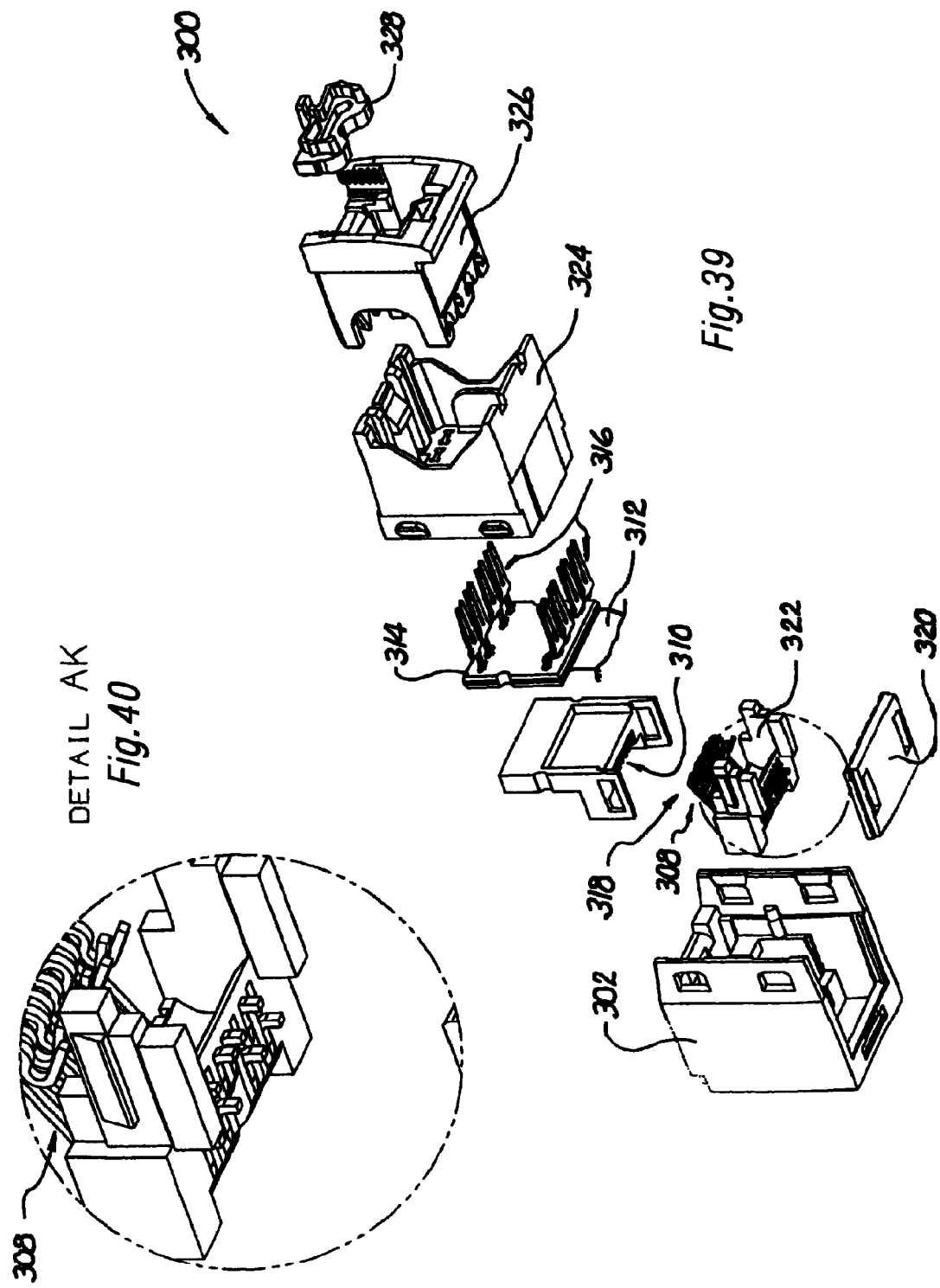

METHOD FOR REDUCING CROSSTALK IN ELECTRICAL CONNECTORS

CROSS-REFERENCE TO RELATED APPLICATIONS

This application is a continuation of U.S. patent application Ser. No. 11/833,686, filed Aug. 3, 2007, which is a continuation of U.S. patent application Ser. No. 11/078,816 filed Mar. 11, 2005, which claims the benefit of U.S. Provisional Application No. 60/558,657, filed Apr. 1, 2004; and U.S. Provisional Application No. 60/552,995, filed Mar. 12, 2004, which are incorporated herein by reference in their entireties.

TECHNICAL FIELD

The present invention relates to electrical connectors and more particularly relates to modular communication connectors that utilize compensation techniques to reduce net crosstalk generated by the combination of a plug and a jack of a connector assembly.

BACKGROUND

Computer networks, including local area networks (LANs) and wide area networks (WANs), are becoming increasingly prevalent as the number of computers and network devices in the workplace grows. These computer networks utilize data communication cables and electrical connectors to transmit information between various components attached to the network. The electrical connectors are typically configured to include a plug that is connectable to a jack mounted in the wall, or integrated into a panel or other telecommunication equipment. The jack typically includes a housing that holds an array of closely spaced parallel contacts for contacting corresponding conductors of the plug. The contacts of a jack are often mounted onto a printed circuit board. An RJ45 plug and jack connector assembly is one well-known standard connector assembly having closely spaced contacts.

Over the past several years, advances in computer networking technology have facilitated a corresponding increase in the rate at which data can be transmitted through a network. Conventional connectors have been used to transmit low-frequency data signals without any significant crosstalk problems. However, when such connectors are used to transmit high-frequency data signals, crosstalk generated within the connector increases dramatically. This crosstalk is primarily due to the capacitive and inductive couplings between the closely spaced parallel conductors within the jack and/or the plug.

A wide variety of improvements have been made in the design of electrical connectors to reduce crosstalk occurring within connectors. One example is disclosed in U.S. Pat. No. 6,305,950, which is commonly assigned to Panduit Corporation. This type of connector uses a particular conductor configuration in conjunction with a multi-layered printed circuit board containing capacitors to achieve a reduction in the crosstalk effect. However, due to the high level of crosstalk occurring in the plug for this connector at very high-frequency signal rates, the tuning effect achievable by the capacitors can still be difficult to accomplish. As such, further improvements in the design of connectors are still needed to address such problems and provide improved crosstalk performance.

SUMMARY OF THE INVENTION

According to one embodiment of the present invention, a communications connector utilizes a flexible printed circuit to provide crosstalk compensation. The flexible printed circuit is in electrical contact with contacts of the communications connector.

BRIEF DESCRIPTION OF FIGURES

FIG. 6a is a detail view of Zone A of the flexible printed circuit of FIG. 6;

FIG. 6b is a detail view of Zone B of the flexible printed circuit of FIG. 6;

FIG. 6c is a detail view of Zone C of the flexible printed circuit of FIG. 6;

FIG. 6d is a detail view of Zone D of the flexible printed circuit of FIG. 6;

FIG. 6h is a plan view of the flexible printed circuit of FIG. 6 showing a conductive trace associated with a first conductor;

FIG. 6i is a plan view of the flexible printed circuit of FIG. 6 showing a conductive trace associated with a second conductor;

FIG. 6j is a plan view of the flexible printed circuit of FIG. 6 showing a conductive trace associated with a third conductor;

FIG. 6k is a plan view of the flexible printed circuit of FIG. 6 showing a conductive trace associated with a fourth conductor;

FIG. 6l is a plan view of the flexible printed circuit of FIG. 6 showing a conductive trace associated with a fifth conductor;

FIG. 6m is a plan view of the flexible printed circuit of FIG. 6 showing a conductive trace associated with a sixth conductor;

FIG. 8a is a sectional view of the flexible printed circuit of FIG. 6 taken along the line B-B of FIG. 6g;

FIG. 8b is a sectional view of the flexible printed circuit of FIG. 6 taken along the line C-C of FIG. 6g;

FIG. 9 is a sectional view of the flexible printed circuit of FIG. 6 taken along the line D-D of FIG. 6g;

FIG. 10a is a sectional view of the flexible printed circuit of FIG. 6 taken along the line E-E of FIG. 6g;

FIG. 10b is a sectional view of the flexible printed circuit of FIG. 6 taken along the line F-F of FIG. 6g;

FIG. 19 is an exploded view of the electrical jack of FIG. 18;

FIG. 20 is a detail view of the detail N of FIG. 19;

FIG. 24 is a top view of IDCs of FIG. 23;

FIG. 25 is a front view of the IDCs of FIG. 23;

FIG. 26 is a rear view of the IDCs of FIG. 23;

FIG. 27 is a side view of the IDCs of FIG. 23;

FIG. 28 is a detail view of the detail O of FIG. 27;

FIG. 29 is a detail view of the detail P of FIG. 27;

FIG. 30 is a sectional view taken along the line Q-Q of FIG. 27;

FIG. 36 is an upper right-hand front exploded perspective view of a jack in accordance with an embodiment of the present invention;

FIG. 37 is a close-up view showing detail of the front sled with contacts, including spring contacts;

FIG. 38 is a close-up view showing detail of the rear contact guides;

FIG. 39 is a lower left-hand rear exploded perspective view of a jack in accordance with an embodiment of the present invention;

FIG. 40 is a close-up view showing detail of the bottom of the front sled with contacts, including spring contacts;

DETAILED DESCRIPTION OF PREFERRED EMBODIMENTS

The present invention is directed to methods and apparatus for reducing crosstalk in electrical connectors. The present invention utilizes crosstalk-reduction principles of U.S. Pat. No. 5,997,358 to Adriaenssens et al., which is incorporated herein by reference in its entirety. The present application further incorporates by reference in its entirety commonly-assigned U.S. Provisional Patent Application No. 60/544,050 entitled "Methods and Apparatus for Reducing Crosstalk in Electrical Connectors," filed Feb. 12, 2004, and commonly-assigned U.S. patent application Ser. No. 11/055,344, entitled "Methods and Apparatus for Reducing Crosstalk in Electrical Connectors," filed Feb. 10, 2005.

Figure 1:
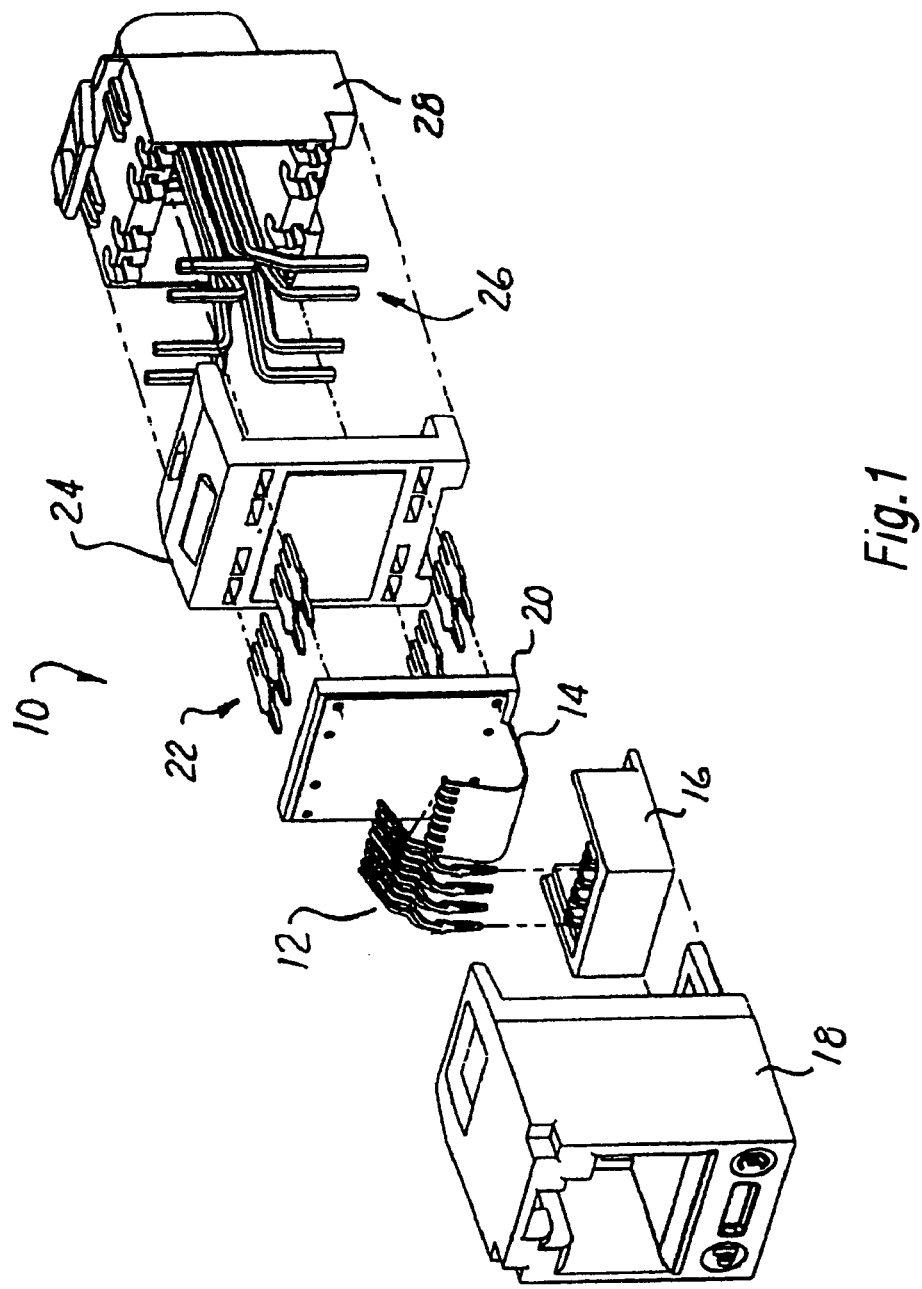
FIG. 1 is an exploded view of an electrical jack according to one embodiment of the present invention.

Turning now to FIG. 1, an exploded view of an electrical jack 10 is shown. Contacts 12 are adapted to make physical and electrical contact with contacts of a plug (not shown in FIG. 1) and further to make electrical contact with a flexible printed circuit (FPC) 14. The contacts 12 are mechanically mounted in a contact sled 16 and the contact-and-sled assembly is adapted for insertion into a main jack housing 18.

In the embodiment shown in FIG. 1, the FPC 14 has a rigid extension 20 adapted for accepting insulation displacement connectors (IDCs) 22. According to one embodiment of the present invention, the rigid extension 20 is an integral end portion of the FPC. The IDCs 22 extend through a rear housing 24 and make physical and electrical contact with conductors 26. In the embodiment of FIG. 1, eight conductors 26 are provided in four pairs. A termination cap 28 encloses the connections between the IDCs 22 and the conductors 26. Other styles of terminations, such as punch-down style terminations, may also be used with the present invention.

Figure 2:
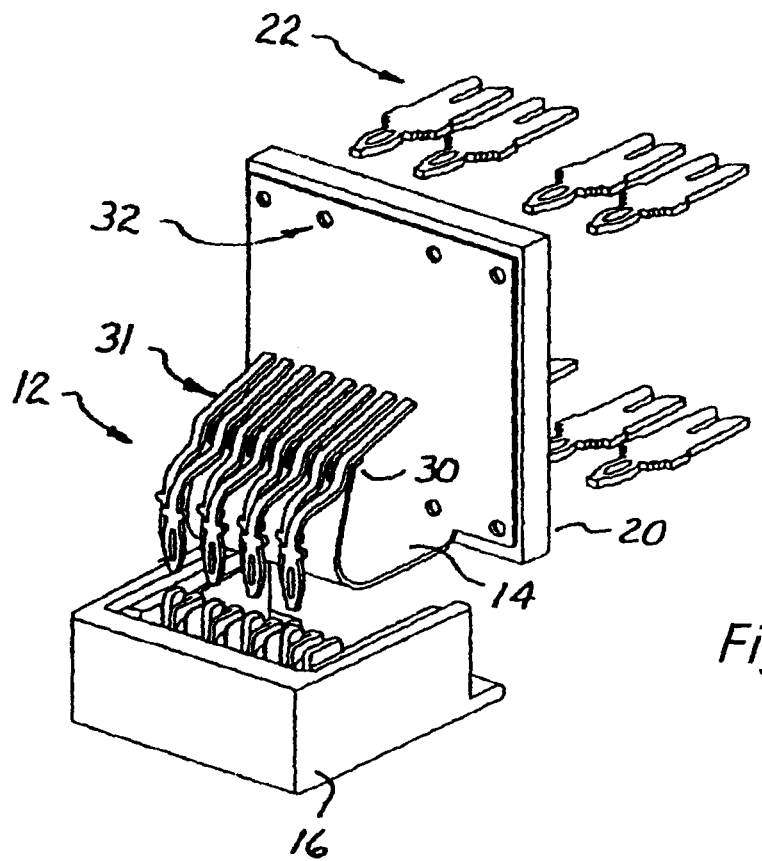
FIG. 2 is an exploded view of a contact assembly showing the use of a flexible printed circuit.
Figure 3:
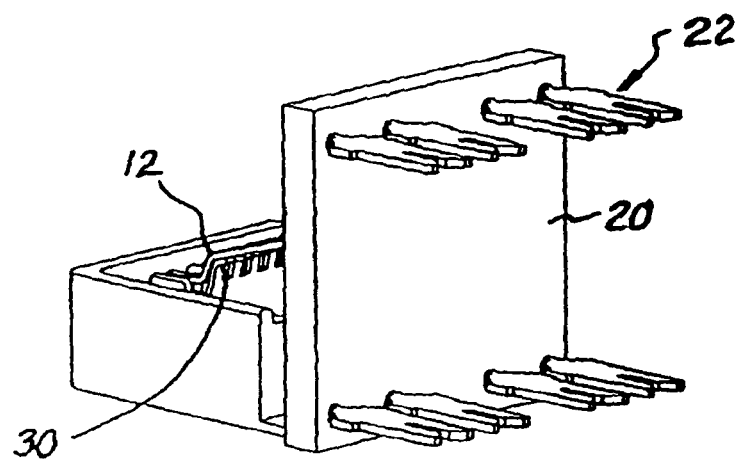
FIG. 3 is a rear perspective view of the contact assembly of FIG. 2.

Turning now to FIG. 2, an exploded view of a contact assembly shows the connection between the contacts 12 and the FPC 14 at jack contact points 30 of the FPC 14. The mechanical and electrical connection between the FPC 14 and the contacts 12 is directly under the plug/jack interface 31. The jack contact points 30 of the FPC 14 are preferably attached to the contacts 12 opposite a plug/jack interface by electrical resistance welding of solder rivets. The jack contacts 12 are relatively short and they do not conduct signal current down their length. The IDCs 22 extend through the rigid extension 20 of the FPC 14 into IDC sockets 32 of the FPC 14. FIG. 3 is a back perspective view of the contact assembly of FIG. 2 showing the jack contact points 30 of the FPC contacting the contacts 12 and further showing the IDCs 22 extending from the rigid extension 20 of the FPC 14.

Figure 4:
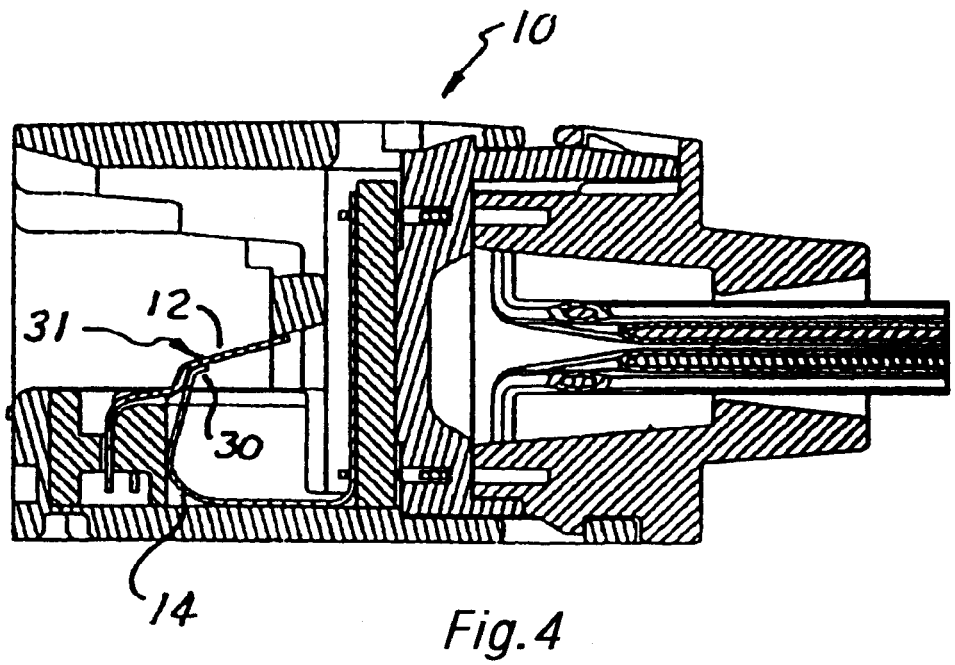
FIG. 4 is a side cutaway view of the electrical jack of FIG. 1.
Figure 5:
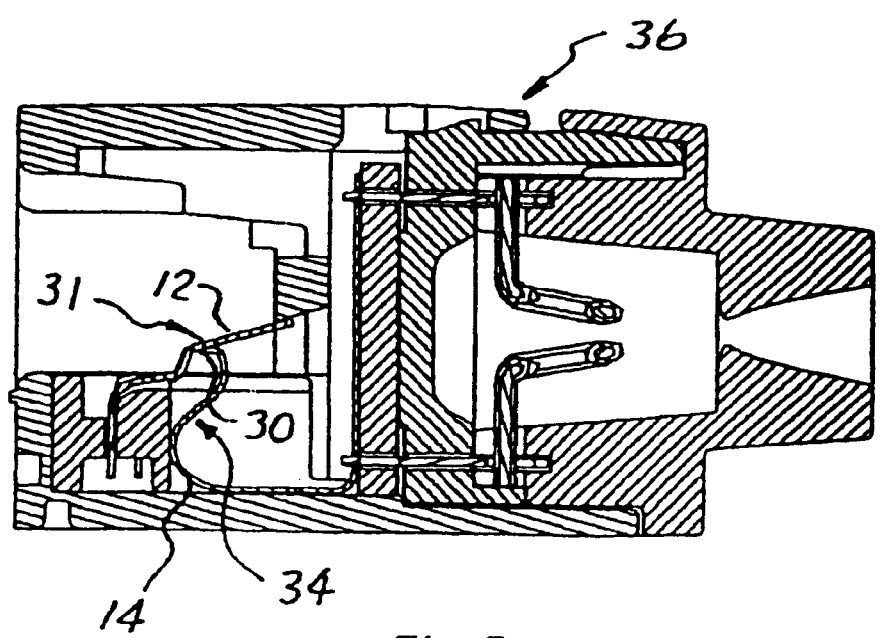
FIG. 5 is a side cutaway view of an electrical jack according to an alternative embodiment of the present invention.

FPCs according to the present invention may be positioned in a variety of ways. For example, FIGS. 4 and 5 are side cutaway views showing two configurations of an FPC 14 in electrical jacks. In FIG. 4, the FPC 14 is placed such that the jack contact points 30 of the FPC 14 bend toward the rear of the electrical jack 10. This is the configuration shown in FIG. 1. FIG. 5 shows an alternative configuration in which a forward bend 34 is provided in the FPC 14 such that the jack contact points 30 bend toward the front of the alternative electrical jack 36. In FIGS. 4 and 5, the jack contact points 30 of the FPC 14 contact the contacts 12 of the jacks directly under the plug/jack interface 31.

Figure 6:
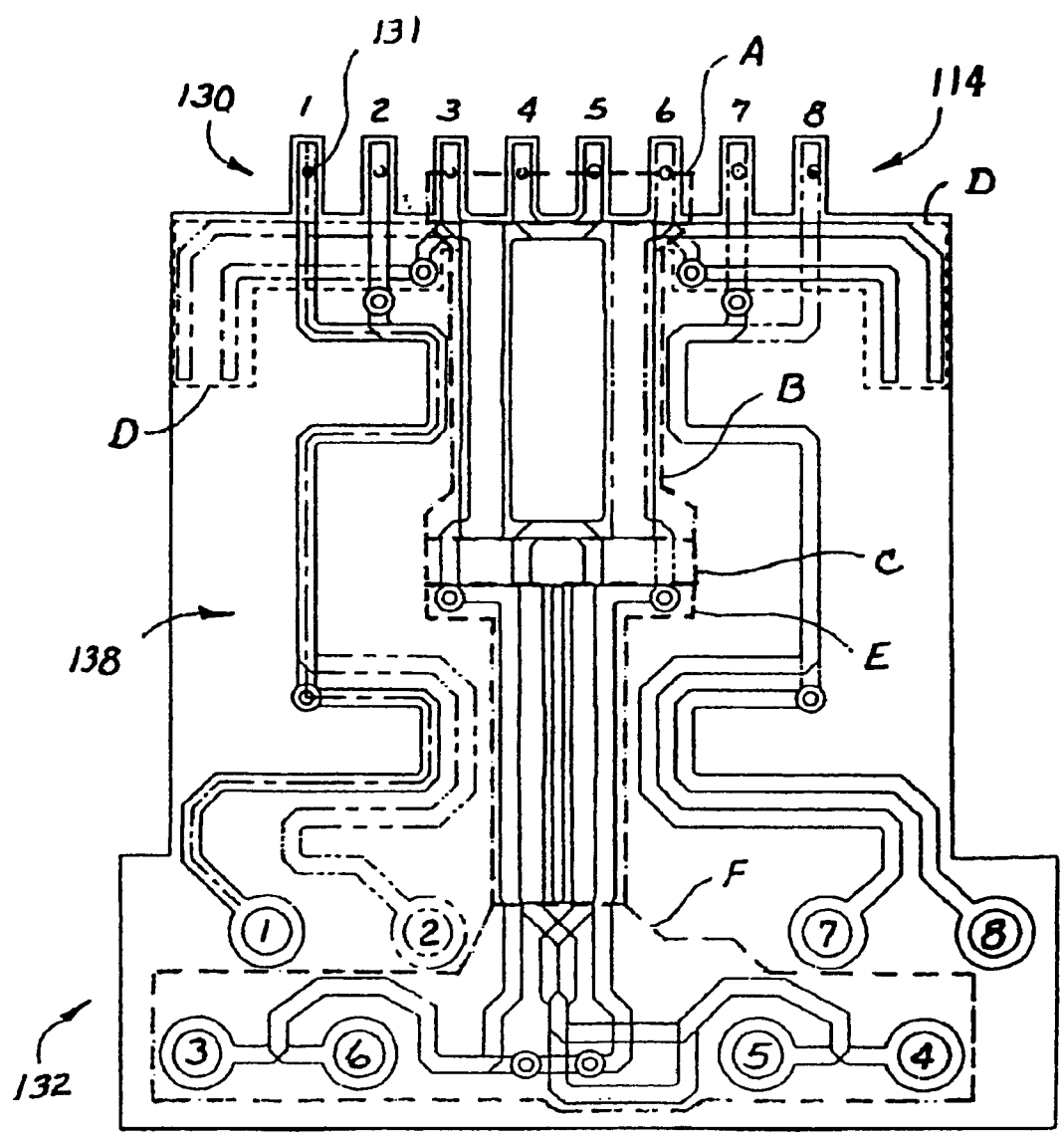
FIG. 6 is a plan view of a flexible printed circuit showing zones A-F.
Figure 6E:
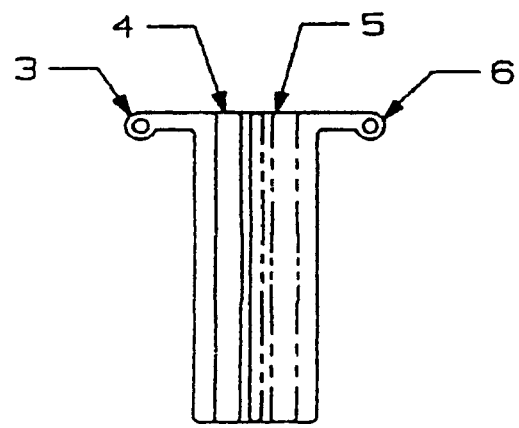
FIG. 6e is a detail view of Zone E of the flexible printed circuit of FIG. 6.
Figure 6F:
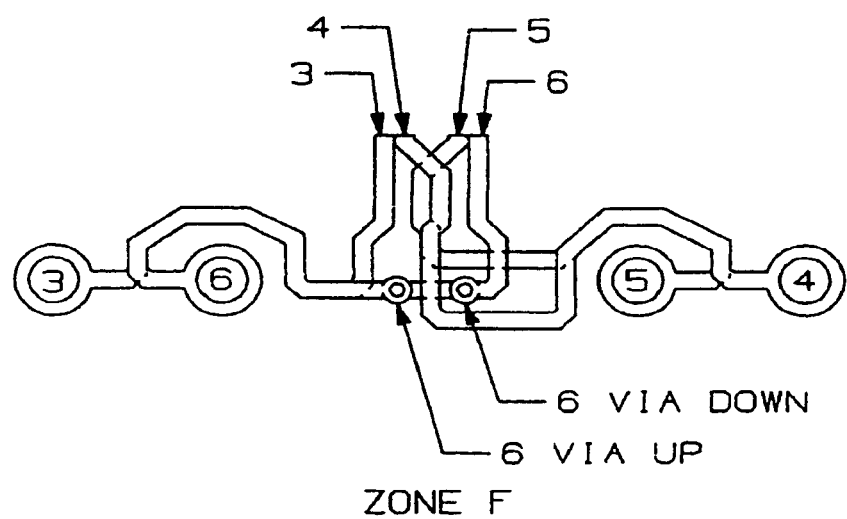
FIG. 6f is a detail view of Zone F of the flexible printed circuit of FIG. 6.

Turning now to FIG. 6, a plan view of an FPC 114 according to one embodiment of the present invention is shown. Jack contact points 130 include solder rivets 131 for electrical resistance welding to jack contacts. The jack contact points 130 are numbered one through eight to correspond to eight conductors (provided in four pairs), and IDC sockets 132 are numbered correspondingly. Conductive traces 138 are provided on the FPC 114. The FPC 114 is adapted for use in a "horizontal extension" embodiment of a jack as shown in FIGS. 18-22.

The FPC 114 electrically connects each jack contact to an IDC and it provides compensation for the crosstalk couplings of a specification plug. It utilizes the teachings of U.S. Pat. No. 5,997,358 to provide said compensation. The FPC 114 is divided into zones as shown in FIG. 6.

The critical pair compensation is for conductor pairs 3,6 to 4,5 as shown in FIG. 6. The zone descriptions below pertain to these pairs and the following statements regarding couplings pertain to couplings between these pairs. The regions of Zones A, B, C, D, E, and F are shown in FIG. 6 with dotted boxes and plan views of the conductive traces in Zones A-F are shown in FIGS. 6a-6f, respectively.

Zone A is a transition zone from the connection to the jack contacts 112 (shown in FIG. 18) to the near-end crosstalk (NEXT) compensation zone.

Zone B is the NEXT compensation zone.

Zone C is a transition zone from the NEXT compensation zone to the NEXT crosstalk zone. The design objectives of this zone are to make its inductive and capacitive couplings and the length of the circuit paths equal to those of Zone A.

Zone E is the NEXT crosstalk zone.

Zone F is a neutral zone which connects the NEXT crosstalk zone to the IDC sockets 32.

The magnitude of the total crosstalk coupling of the NEXT crosstalk zone is approximately equal to that of a specification plug.

The magnitude of the total compensation coupling of the NEXT compensation zone is slightly less than twice the crosstalk coupling of a specification plug plus twice the total coupling of Zone A.

All the above Zones A-C, E, and F have distributed couplings and no remote couplings.

The phase angle change between the effective center of couplings of a specification plug and the center of the NEXT compensation zone is approximately equal to the phase angle change between the center of the NEXT crosstalk zone and the NEXT compensation zone.

The combination of the jack and a specification plug is therefore symmetrical about the center of the NEXT compensation zone.

The result of the above is that Forward NEXT is equal to Reverse NEXT.

Since the NEXT compensation zone is connected to the plug/jack interface by short circuit paths in the FPC, the phase angle change between them is minimized and the change in compensation vs. frequency is minimized.

The total inductive coupling of the NEXT compensation zone is approximately equal to the total inductive couplings of the balance of the circuit path of the jack and a specification plug. The result is a very low FEXT.

The flexibility of the FPC allows it to be connected to all the jack contacts which do not move exactly in unison when a plug is installed. It also facilitates connection to various orientations of IDCs or to a printed circuit board (PCB). The relatively thin dielectric layer of the FPC as compared to that of a PCB facilitates a high density of inductive and capacitive couplings which facilitates a relatively short NEXT compensation zone.

The length of the NEXT compensation zone is preferably approximately equal to the length of the NEXT crosstalk zone. The result is that variations in FPC trace width, which tend to be consistent on an individual FPC, change the capacitive coupling of the NEXT compensation zone and the NEXT crosstalk zone by approximately the same magnitude. This minimizes the compensation variation due to trace width variation.

Zone D is a compensation zone to compensate for the jack contacts. It provides remote capacitive coupling which is connected close to the plug/jack interface.

The circuit paths for pairs 1,2 & 7,8 as shown in FIG. 6 illustrate one way in which compensation between these pair combinations can be attained. The required compensation for these other pairs is much more easily attained than that for pairs 3,6 to 4,5.

FIGS. 6h-6o respectively show conductive traces associated with conductors 1-8, with traces on an upper level of the FPC 114 shown in solid lines and traces on a lower level of the FPC 114 shown in dashed lines. Vias 117 are conductive routes from the upper level to the lower level of the FPC 114. The lengths of conductive traces for pairs 3, 6 and 4, 5 are approximately equal.

Figure 6G:
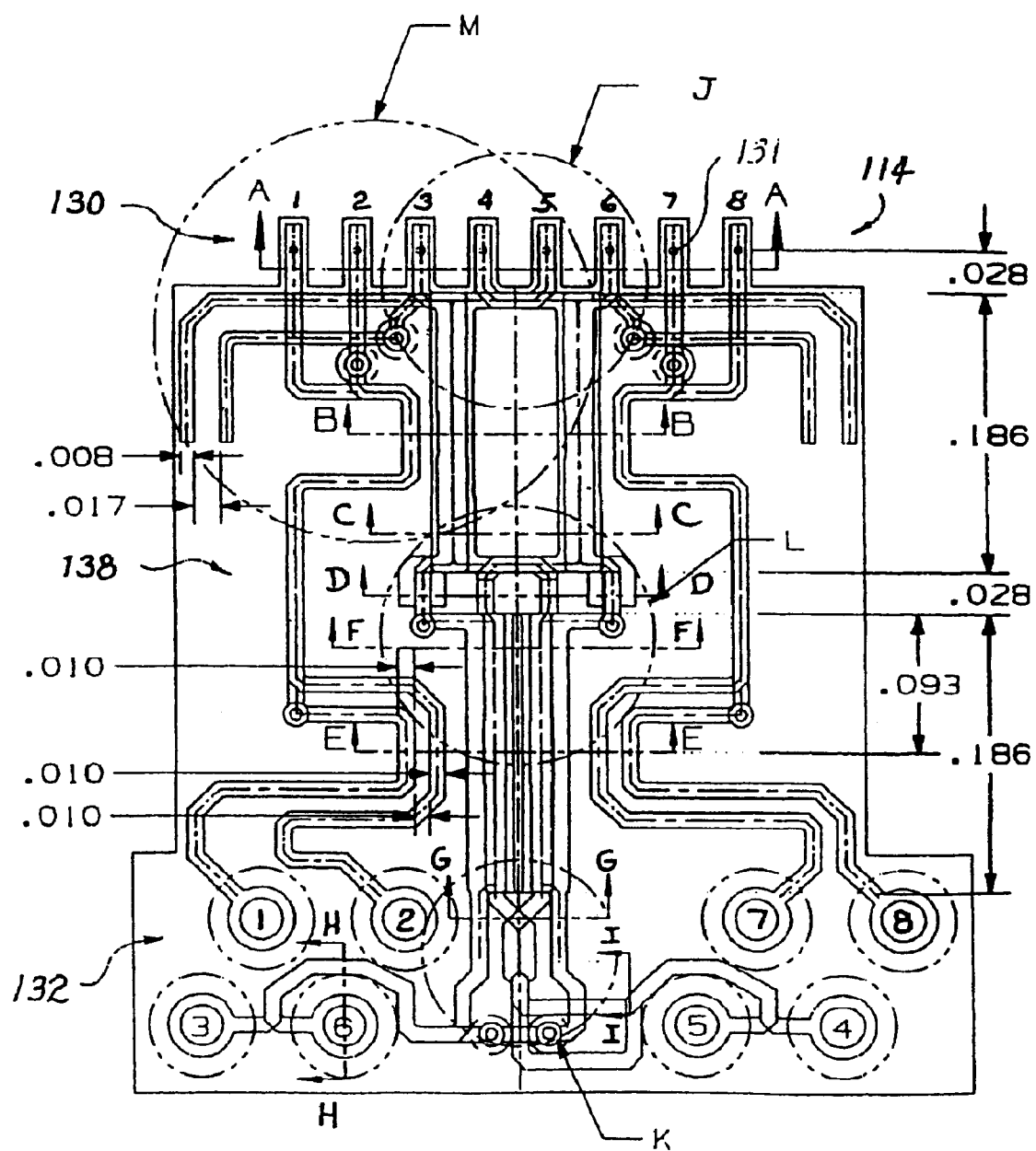
FIG. 6g is a plan view of the flexible printed circuit of FIG. 6, with sectional lines.
Figure 6O:
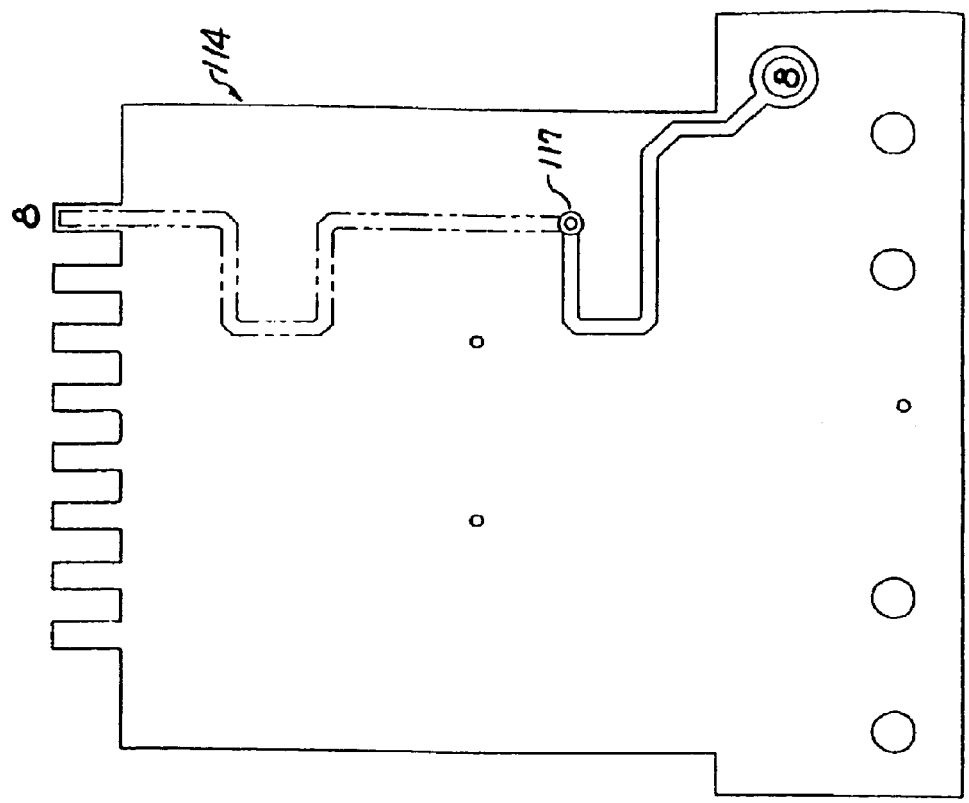
FIG. 6o is a plan view of the flexible printed circuit of FIG. 6 showing a conductive trace associated with an eighth conductor.
Figure 6N:
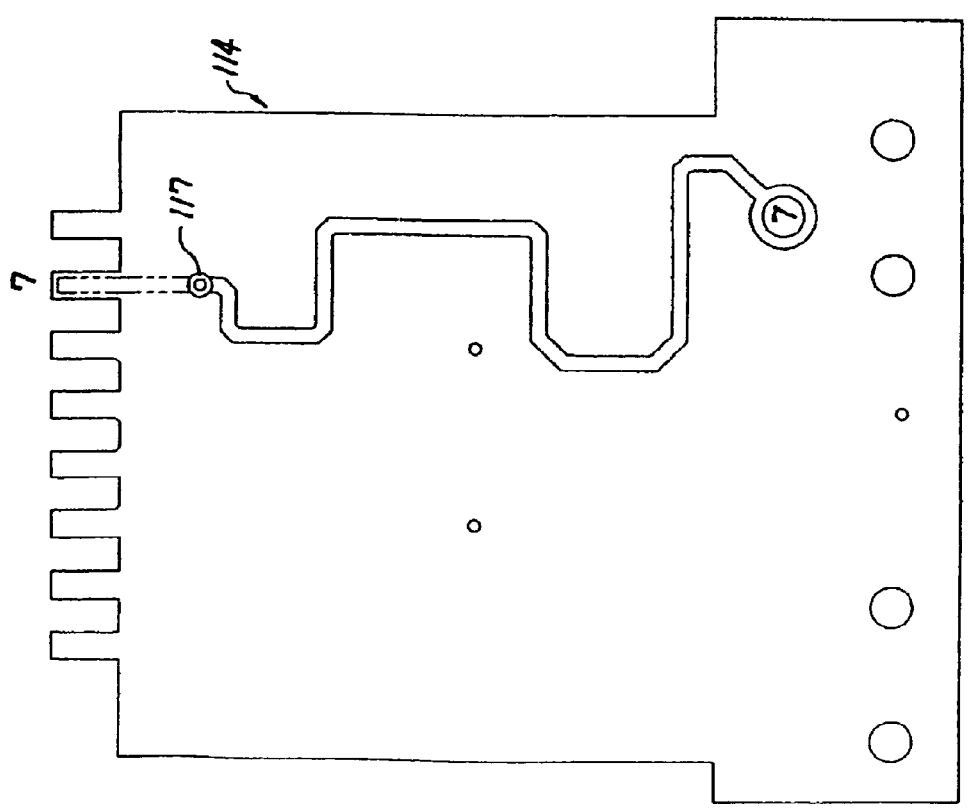
FIG. 6n is a plan view of the flexible printed circuit of FIG. 6 showing a conductive trace associated with a seventh conductor.
Figure 7:
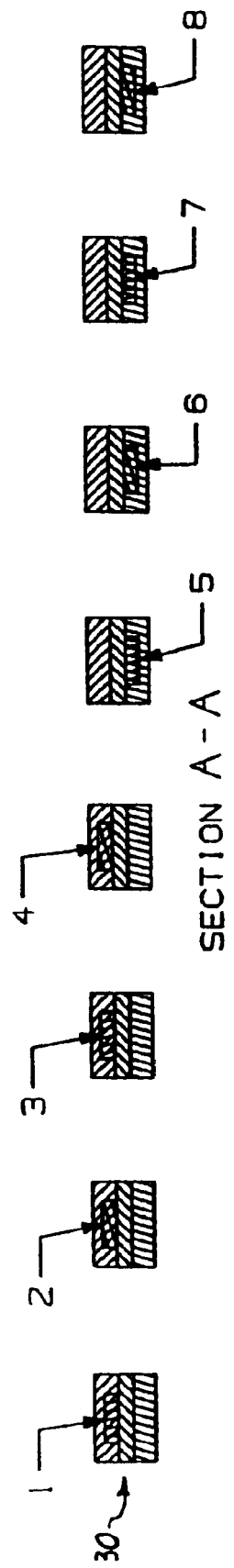
FIG. 7 is a sectional view of the flexible printed circuit of FIG. 6 taken along the line A-A of FIG. 6g.

Turning now to FIG. 7, a cross-sectional view along the line A-A of FIG. 6g, shows cross-sections of the jack contact points 130 of the FPC 114. Similarly, FIG. 8a is a cross-sectional view along the line B-B of FIG. 6g. FIG. 8b is a cross-sectional view along the line C-C of FIG. 6g.

FIG. 9 is a cross-sectional view along the line D-D of FIG. 6g.

FIG. 10a is a cross-sectional view along the line E-E of FIG. 6g.

FIG. 10b is a cross-sectional view along the line F-F of FIG. 6g.

Figure 11:
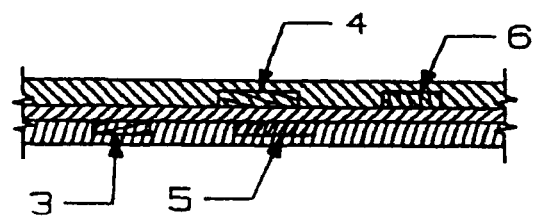
FIG. 11 is a sectional view of the flexible printed circuit of FIG. 6 taken along the line G-G of FIG. 6g.

FIG. 11 is a cross-sectional view along the line G-G of FIG. 6g.

Figure 12:
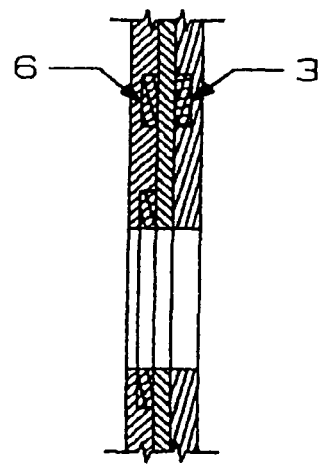
FIG. 12 is a sectional view of the flexible printed circuit of FIG. 6 taken along the line H-H of FIG. 6g.

FIG. 12 is a cross-sectional view along the line H-H of FIG. 6g.

Figure 13:
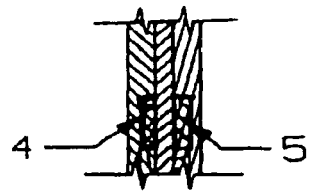
FIG. 13 is a sectional view of the flexible printed circuit of FIG. 6 taken along the line I-I of FIG. 6g.
Figure 14:
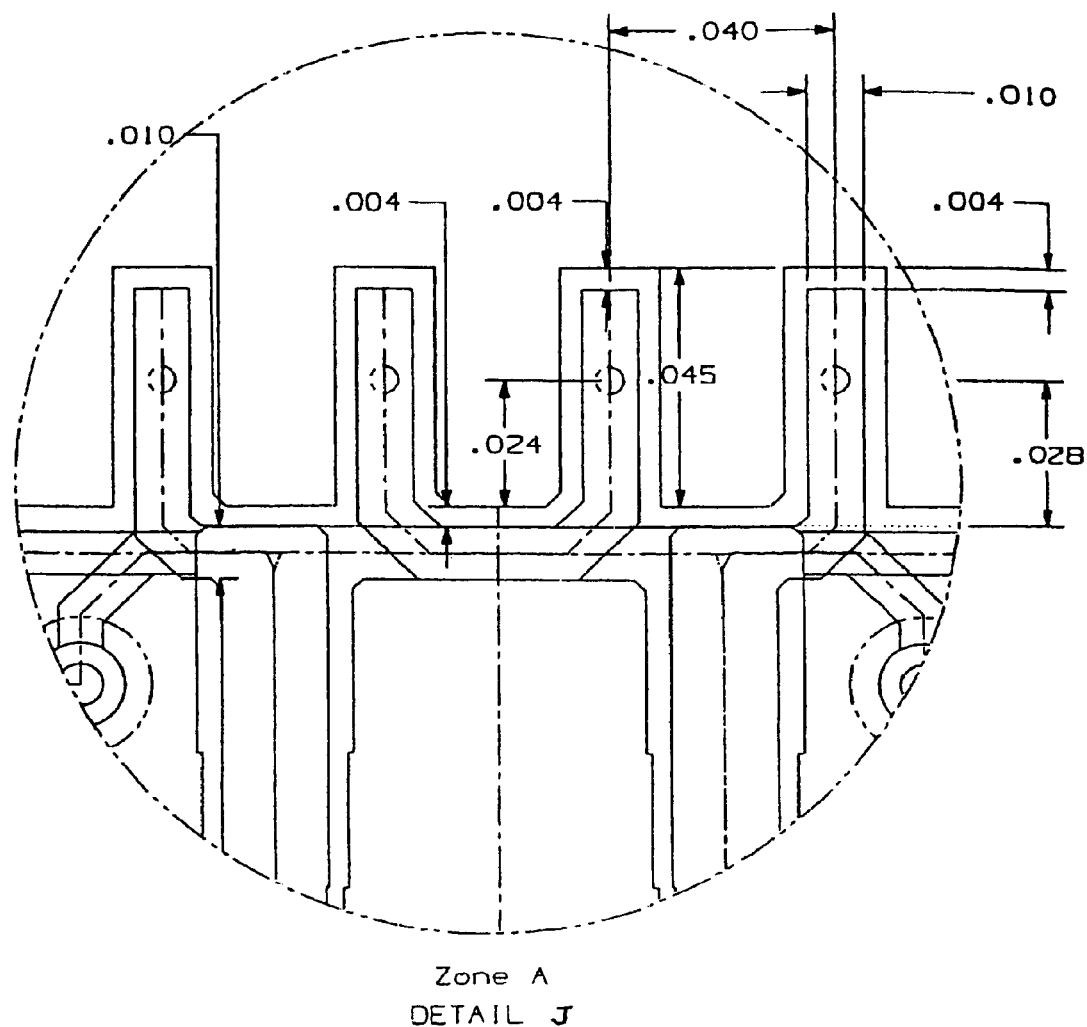
FIG. 14 is a detail view of the detail J of FIG. 6g.
Figure 15:
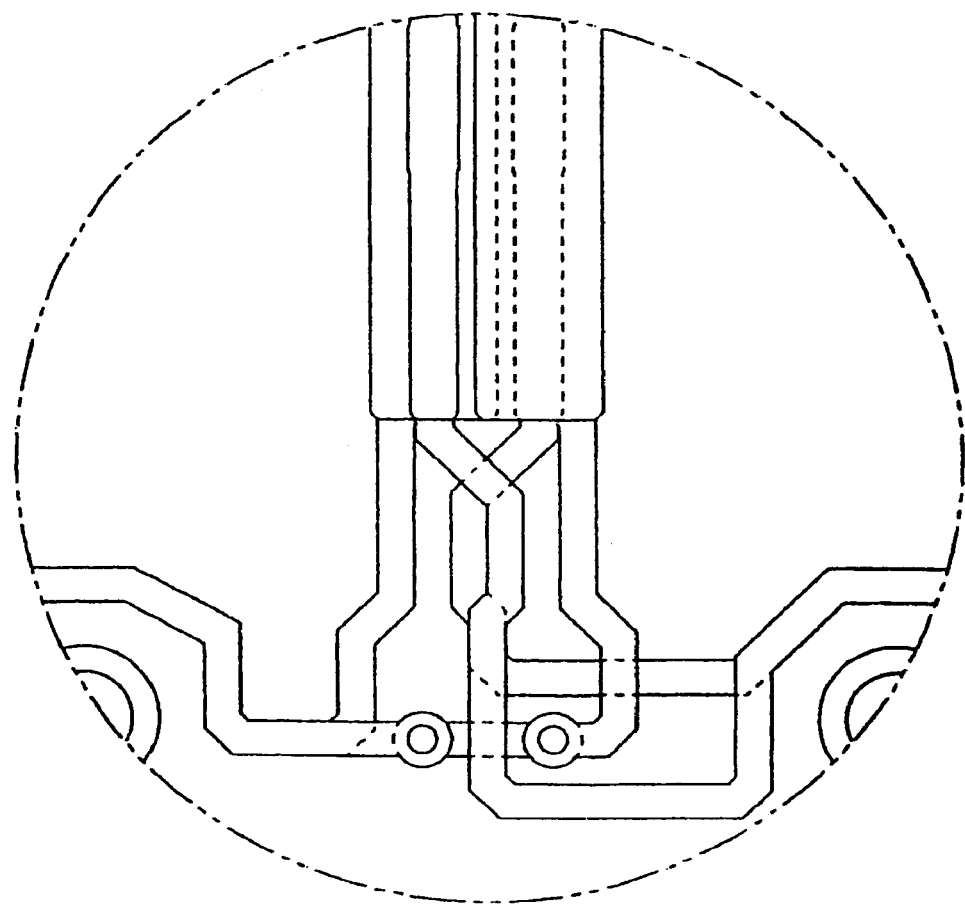
FIG. 15 is a detail view of the detail K of FIG. 6g.
Figure 16:
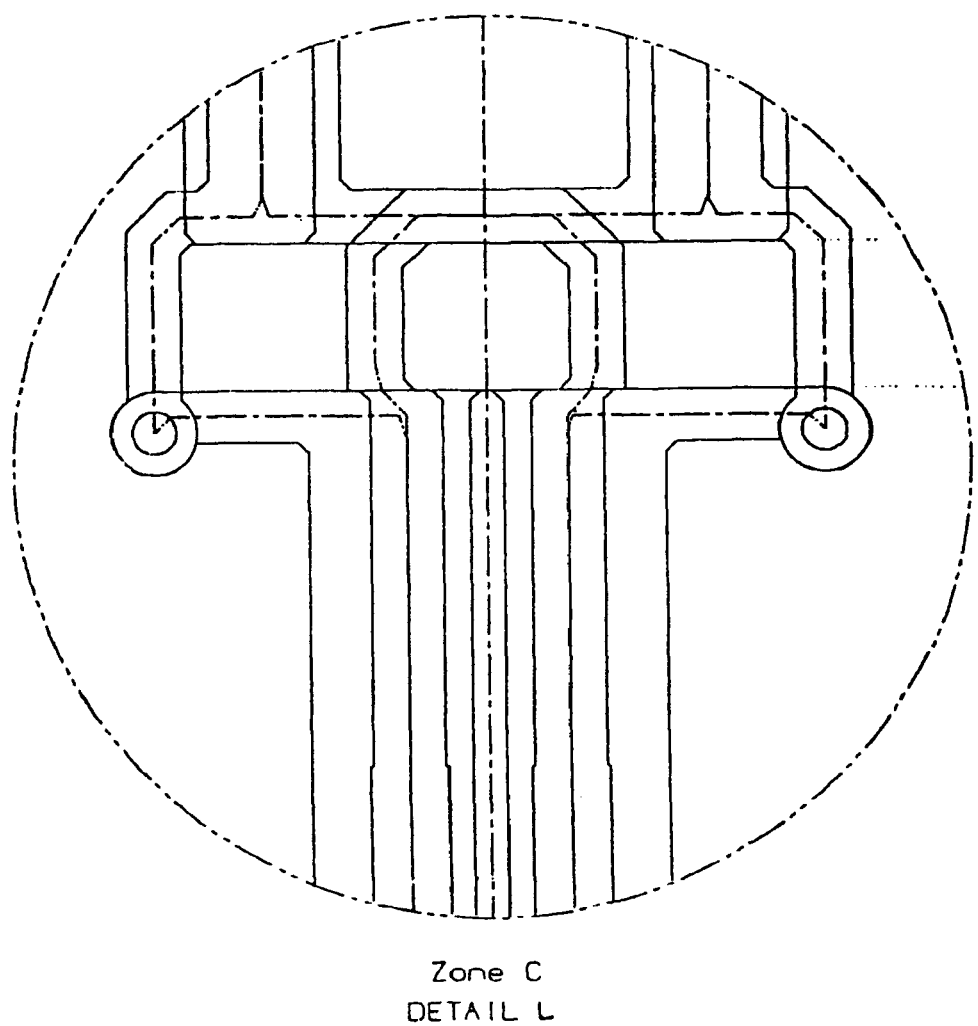
FIG. 16 is a detail view of the detail L of FIG. 6g.
Figure 17:
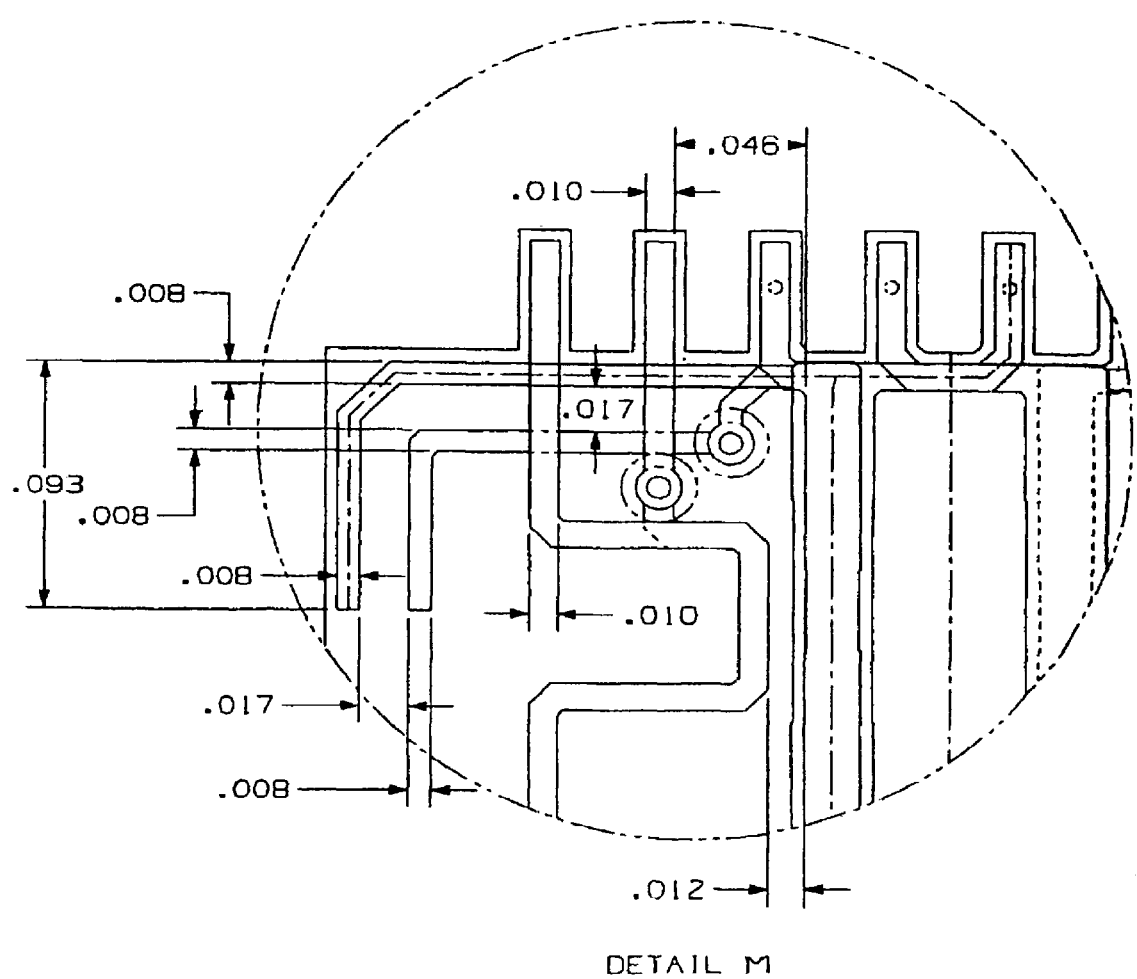
FIG. 17 is a detail view of the detail M of FIG. 6g.

FIG. 13 is a cross-sectional view along the line I-I of FIG. 6g.

The numbers one through eight associated with the conductive traces in FIGS. 7-13 show that the referenced conductive traces correspond to the jack contact points 130 of the FPC 114 and, in turn, with the corresponding conductors to which the jack is connected.

FIGS. 14-17 are, respectively, detail views of detail areas J, K, L, and M of FIG. 6g. Dimensions shown in FIGS. 6g and 7-17 are in inches and are provided for illustration of one particular embodiment of the present invention. It is to be understood that embodiments having different dimensions are contemplated as falling within the scope of the present invention.

Figure 18:
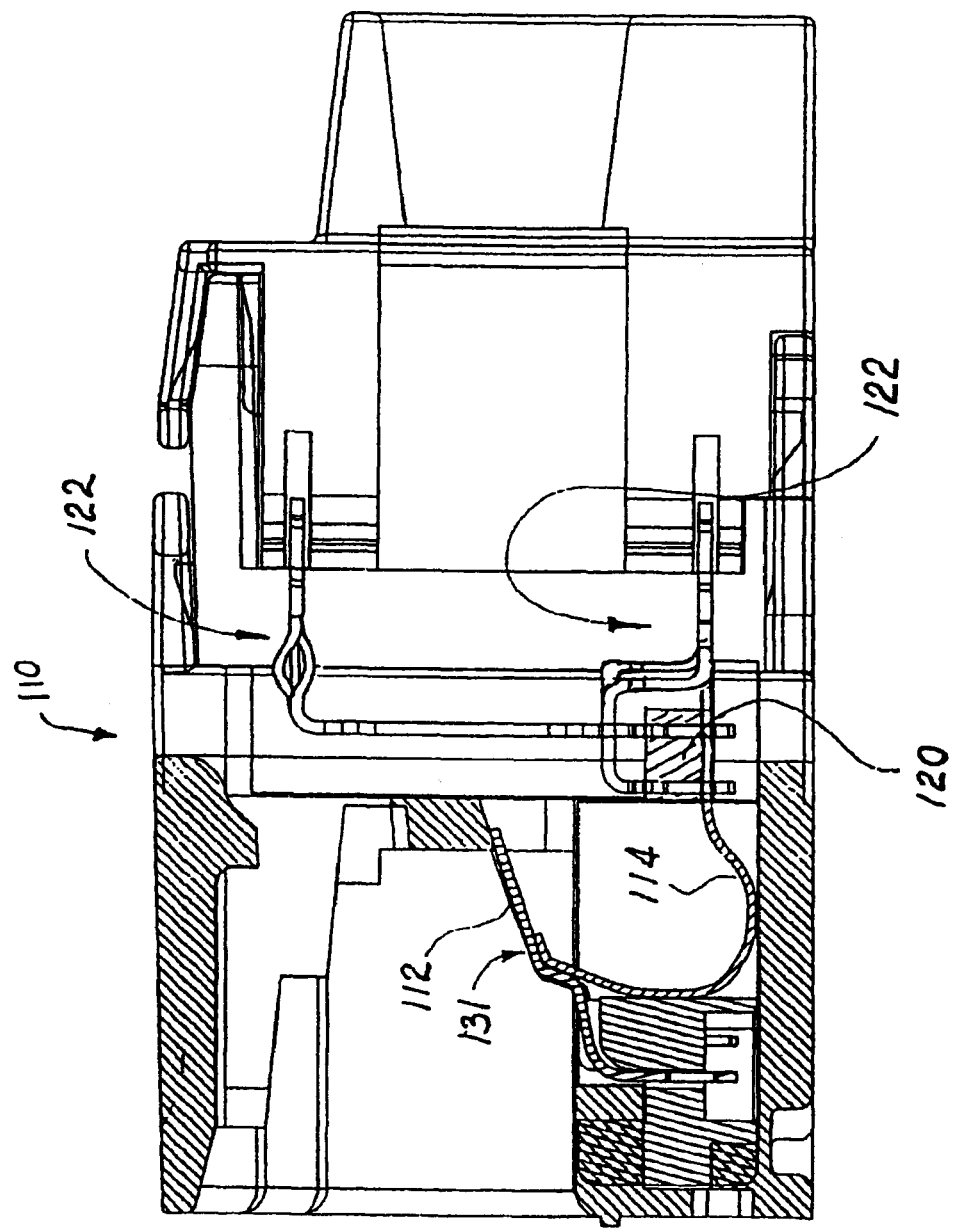
FIG. 18 is a side cutaway view of an electrical jack according to another alternative embodiment of the present invention.

Turning now to FIG. 18, a cross-sectional view of a jack 110 having a horizontal extension 120 of the FPC 114 is shown. As with the embodiment of FIG. 1, the contacts 112 make electrical and mechanical contact with the FPC 114 and the plug-jack interface 131 is disposed directly above the contact between the contacts 112 and the FPC 114. IDCs 122 are inserted into IDC sockets of the horizontal extension 120 of the FPC 114. Other styles of terminations, such as punchdown terminations, may also be used with the present invention.

FIG. 19 is an exploded view of the jack 110. A main jack housing 118 is adapted to hold a sled 116 with contacts 112 mounted therein. An IDC block assembly 115 is attached to a rear housing 124 and a termination cap 128 is provided at the rear of the jack 110. The extension 120 of the FPC 114 is disposed horizontally to accept IDCs 122. FIG. 20 is a detail view of the detail N of FIG. 19 showing the FPC 114 making electrical and mechanical contact with the contacts 112 and further showing IDC sockets 132 adapted to connect to IDCs 122.

Figures 21, 21A:
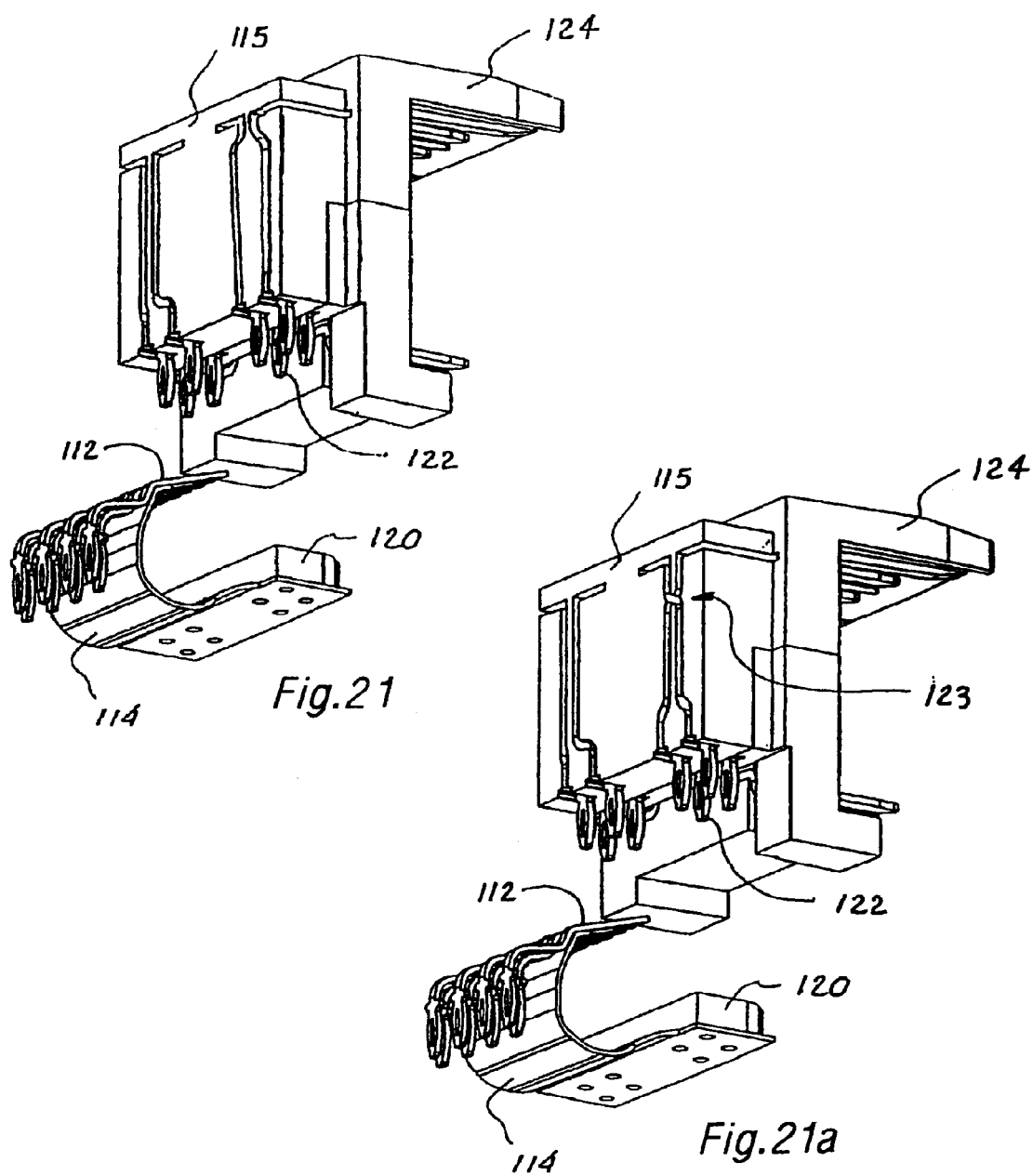
FIG. 21 is a perspective view of a contact-and-housing assembly of the electrical jack of FIG. 18.
FIG. 21a is a perspective view of an alternate embodiment of a contact-and-housing assembly of the electrical jack of FIG. 18.
Figure 22:
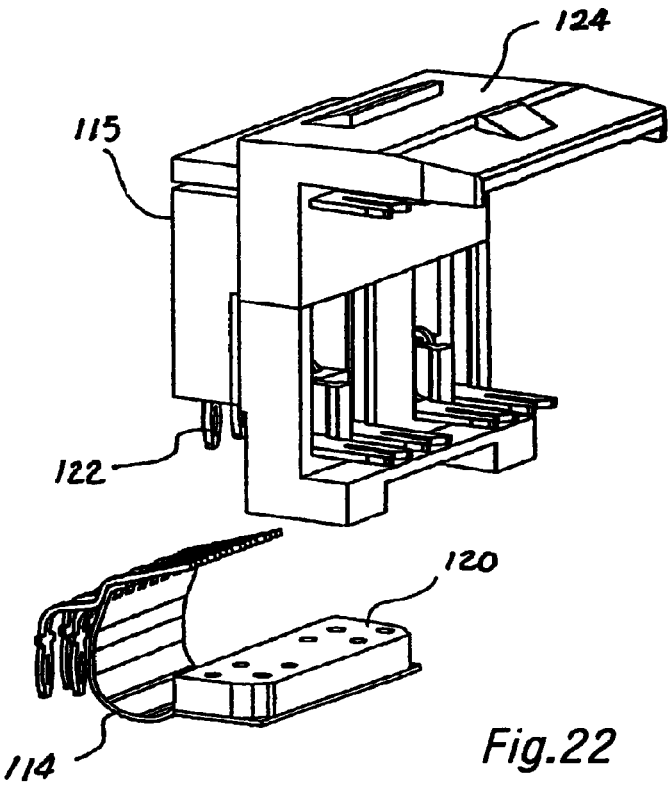
FIG. 22 is a perspective view of the contact-and-housing assembly of the electrical jack of FIG. 18.

FIGS. 21, 21a, and 22 are perspective views showing the housing 124, the IDC block assembly 115, the contacts 112, and the FPC 114 with its horizontally-oriented rigid extension 120. In an alternative embodiment, as shown in FIG. 21a, one or more pairs of IDCs 122 may be provided with crossover stems 123 in the IDC block assembly 115.

Figure 23:
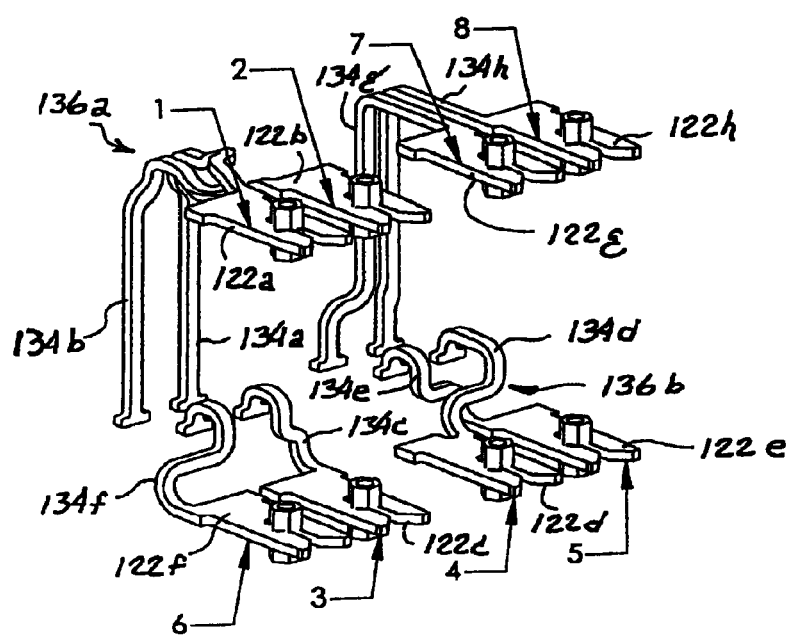
FIG. 23 is a perspective view of IDCs and associated stems according to one embodiment of the present invention.

According to one embodiment of the present invention, illustrated in FIG. 23, IDCs 122 are provided with stems 134, with some stems 134 incorporating crossovers 136. FIG. 23 is a perspective view showing IDCs 122a-h corresponding, respectively, to first through eighth conductors of a jack. First through eighth stems 134a-h correspond respectively to first through eighth IDCs 122a-h. First and second stems 134a and 134b cross over each other at a first crossover 136a, and fourth and fifth stems 134d and 134e cross over each other at a second crossover 136b.

FIG. 24 is a top view of the first, second, seventh, and eighth IDCs 122a, 122b, 122g and 122h showing the first crossover 136a in the first and second stems 134a and 134b.

FIG. 25 is a front view of the IDCs 122a-h and their associated stems 134a-h showing first and second crossovers 136a and 136b. FIG. 26 is a rear view of the IDCs 122a-h showing the features of FIG. 25.

FIG. 27 is a side view of the embodiment of FIG. 23 showing IDCs and associated stems. The first crossover 136a between first and second stems 134a and 134b is shown. FIG. 28 is a view of the detail O of FIG. 27 showing the first crossover 136a. FIG. 29 is a view of the detail P of FIG. 27 showing the third and sixth stems 134c and 134f. FIG. 30 is a sectional view of the section Q-Q of FIG. 27, showing third, fourth, fifth, and sixth IDCs 122c-f with their associated stems 134c-f and further showing the second crossover 136b between the fourth and fifth stems 134d and 134e. Sections of the first, second, seventh, and eighth stems 134a, 134b, 134g, and 134h are also shown in FIG. 30.

Figure 31:
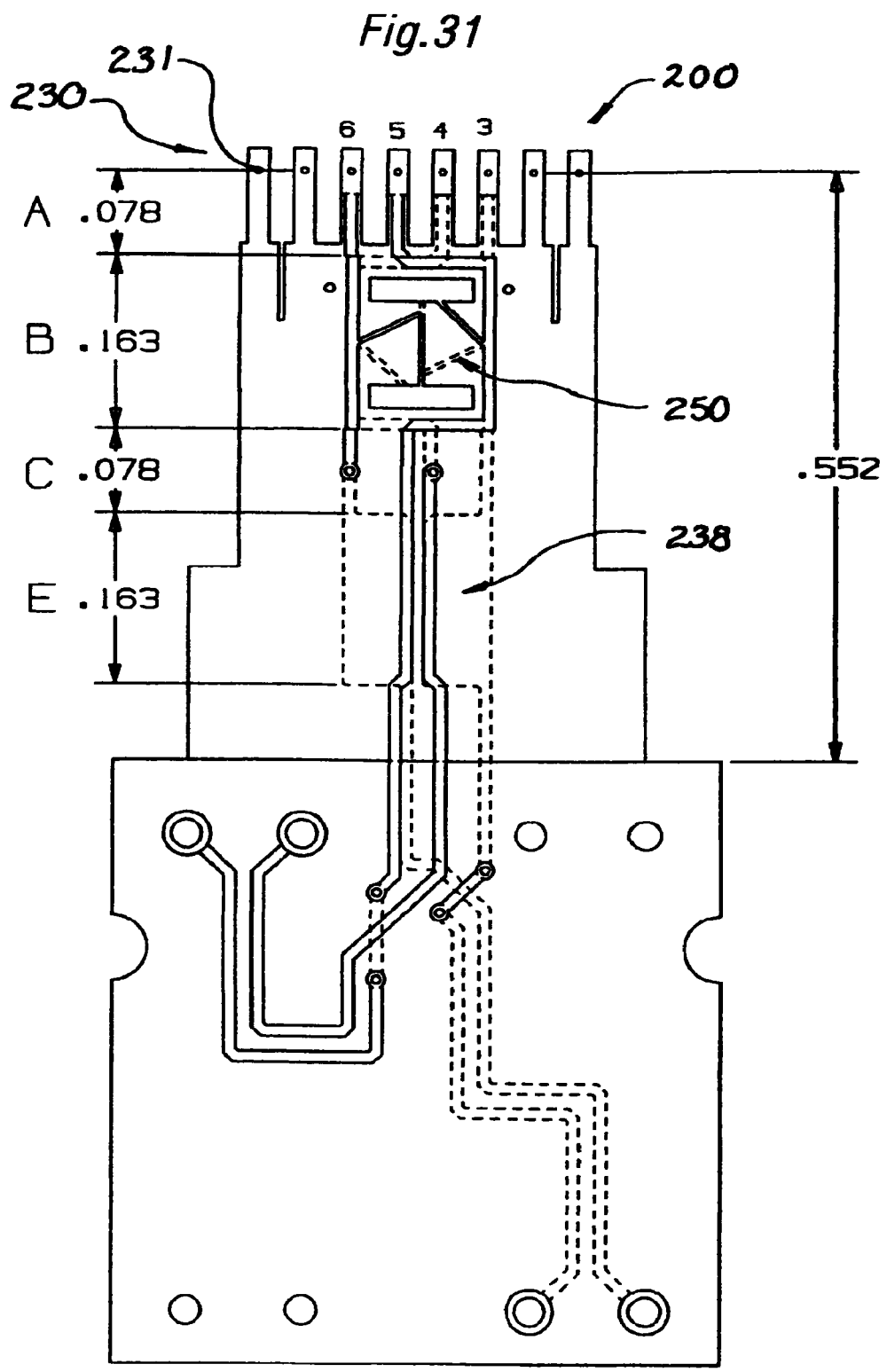
FIG. 31 is a plan view of an alternative FPC 200, which may be used with the jack shown in FIGS. 33-45.

FIG. 31 is a plan view of an alternative FPC 200, which may be used with the jack shown in FIGS. 33-45. Jack contact points 230 include vias (plated through holes) 231 for electrical connection to jack contacts. The jack contact points 230 correspond to eight conductors (provided in four pairs). Only four (conductors 3, 4, 5, and 6) are shown in FIG. 31. Conductive traces 238 are provided on the FPC 200. The FPC 200 is adapted for use in a "vertical extension" embodiment of a jack as shown in FIGS. 33-45.

The FPC 200 electrically connects each jack contact to an IDC and it provides compensation for the crosstalk couplings of a specification plug. It utilizes the teachings of U.S. Pat. No. 5,997,358 to provide said compensation. The FPC 200 is divided into zones as shown in FIG. 31.

The critical pair compensation is for conductor pairs 3,6 to 4,5 as shown in FIG. 31. The zone descriptions below pertain to these pairs and the following statements regarding couplings pertain to couplings between these pairs. The regions of Zones A, B, C, D, and E are shown in FIG. 31. These Zones are identified below, but the functions are described above, with reference to FIGS. 6-17.

Zone A is a transition zone from the connection to the jack contacts to the near-end crosstalk (NEXT) compensation zone.

Zone B is the NEXT compensation zone. As illustrated, it includes an optional variable capacitance 250 (described below, with reference to FIG. 32).

Zone C is a transition zone from the NEXT compensation zone to the NEXT crosstalk zone. The design objectives of this zone are to make its inductive and capacitive couplings and the length of the circuit paths equal to those of Zone A.

Zone E is the NEXT crosstalk zone.

The traces below Zone E in FIG. 31 make up a neutral zone that connects the NEXT crosstalk zone (Zone E) to the IDC sockets.

Figure 32:
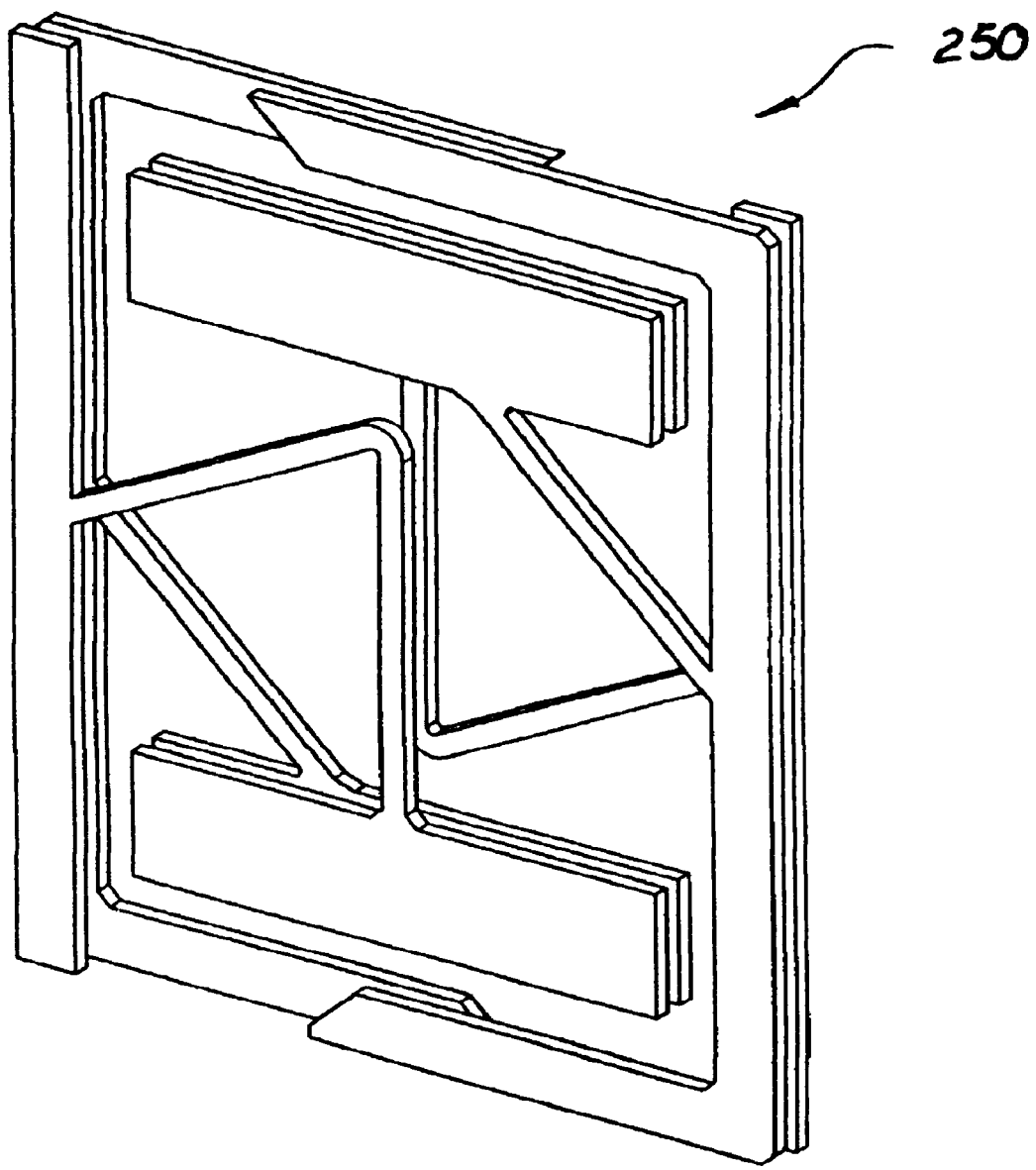
FIG. 32 is a perspective view of the variable capacitance 250 shown in FIG. 31.

FIG. 32 is a perspective view of the variable capacitance 250 shown in FIG. 31. The variable capacitance 250 provides a capacitive coupling that effectively decreases as frequency increases. FIG. 32 is an upper perspective view of this portion showing the capacitive plates, with the substrate removed for ease of illustration. In general, the distributed coupling of the compensation zone would be reduced by the magnitude of capacitive change of the remote coupling of variable capacitance 250. The technology of the variable capacitive coupling is described in U.S. patent application Ser. No. 60/559,846, entitled "Electrical Connector with Improved Crosstalk. Compensation," filed on Apr. 6, 2004 and incorporated herein by reference in its entirety.

Figure 33:
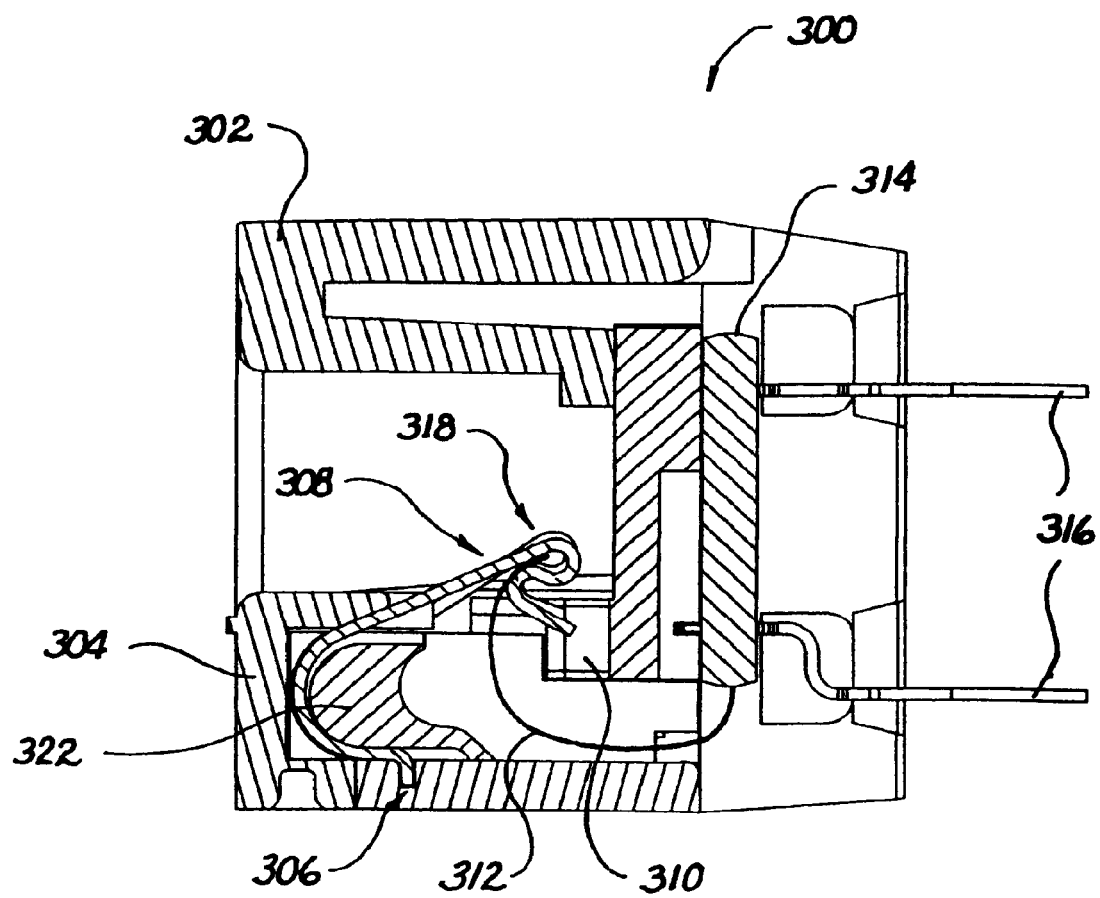
FIG. 33 is a side cutaway view of the front portion of a jack, showing contact 1 or 8 in a combed position.
Figure 34:
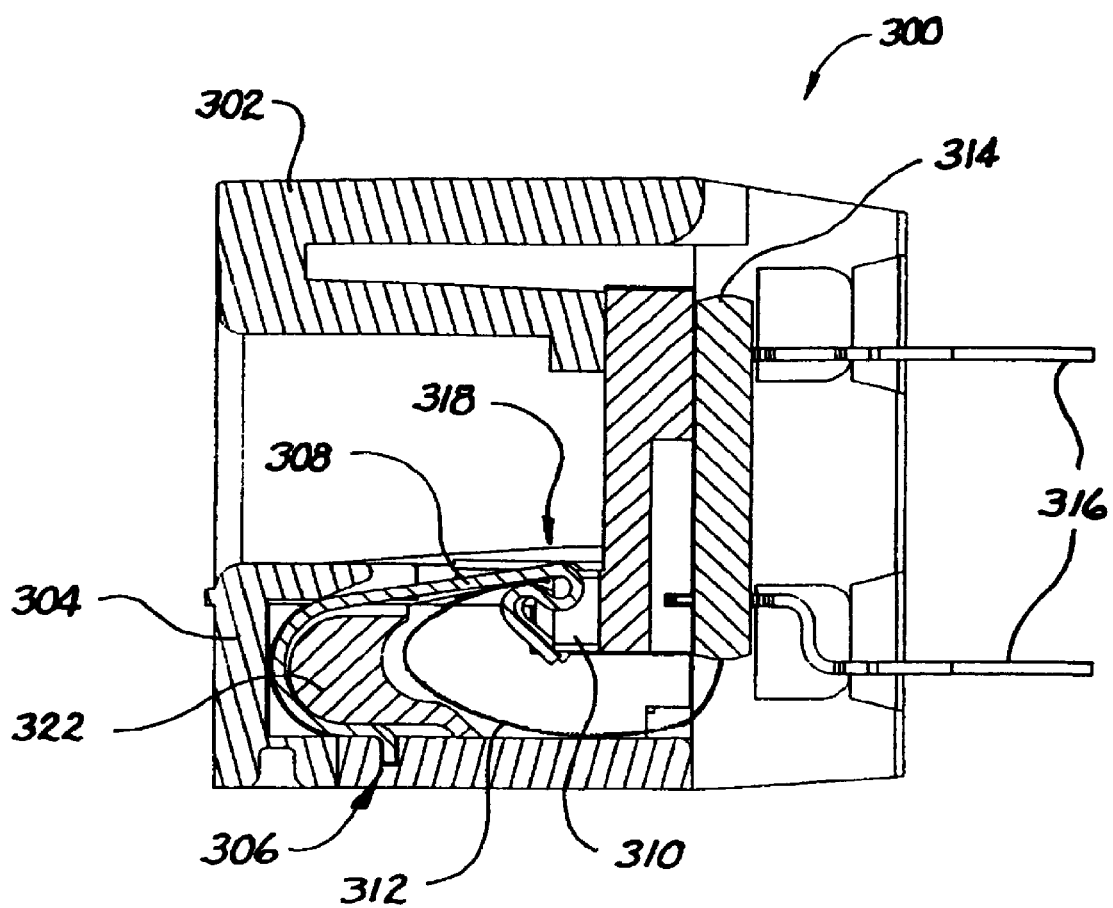
FIG. 34 is a side cutaway view of the front portion of a jack, showing contact 1 or 8 in a solid-plug position.
Figure 35:
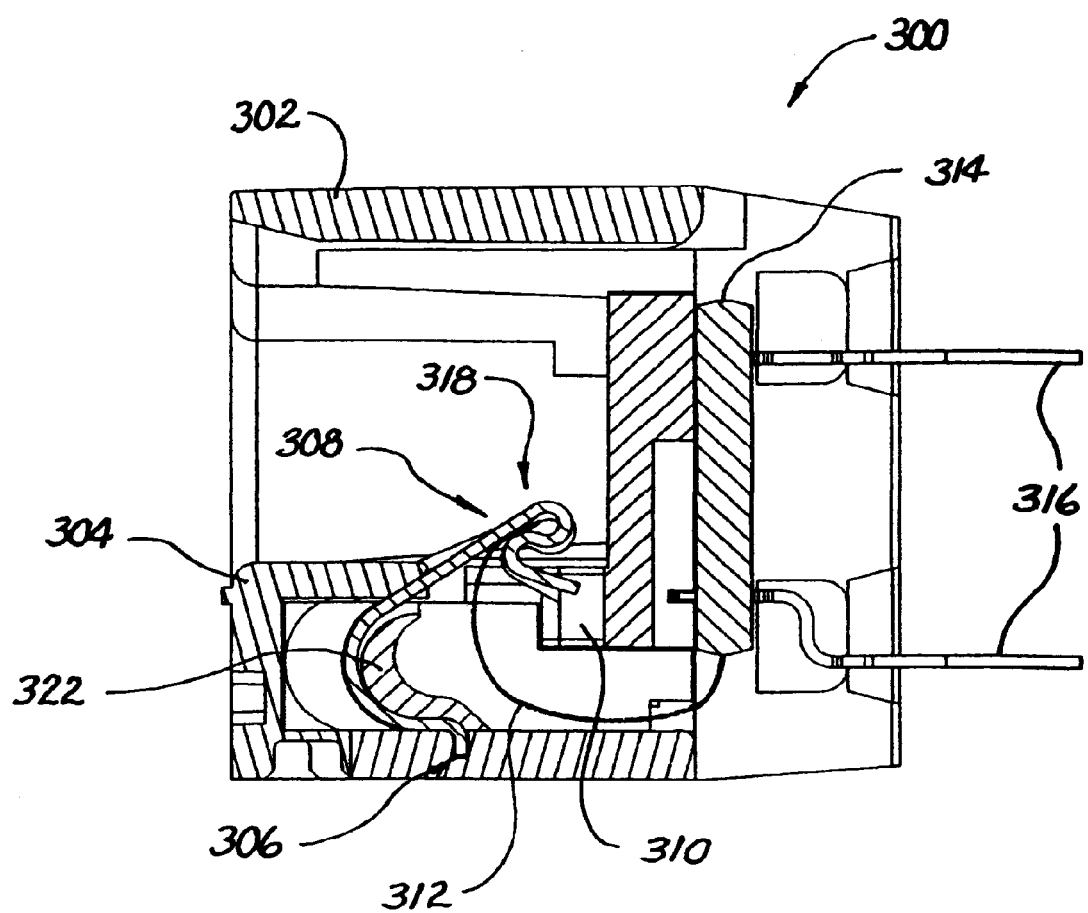
FIG. 35 is a side cutaway view of the front portion of a jack, showing contacts 2, 4, 5, or 7 in a combed position.
Figure 41:
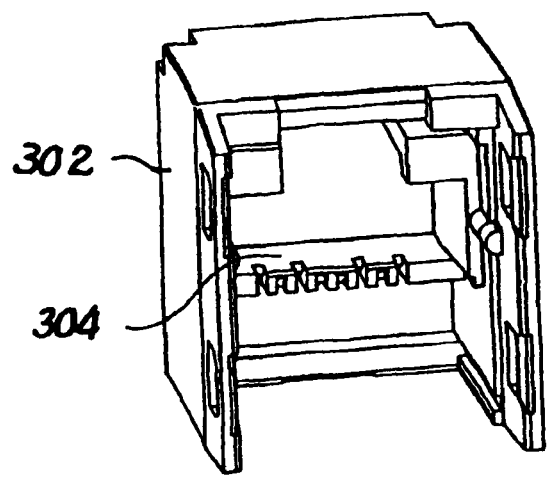
FIG. 41 is a first rear perspective view of the housing of a jack in accordance with an embodiment of the present invention.
Figure 42:
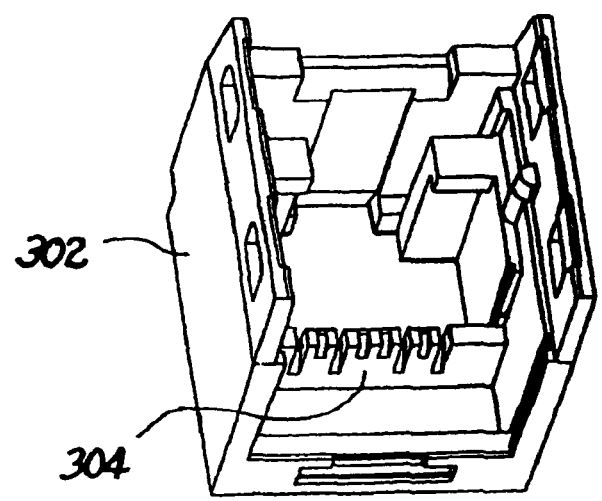
FIG. 42 is a second rear perspective view of the housing of a jack in accordance with an embodiment of the present invention.
Figure 43:
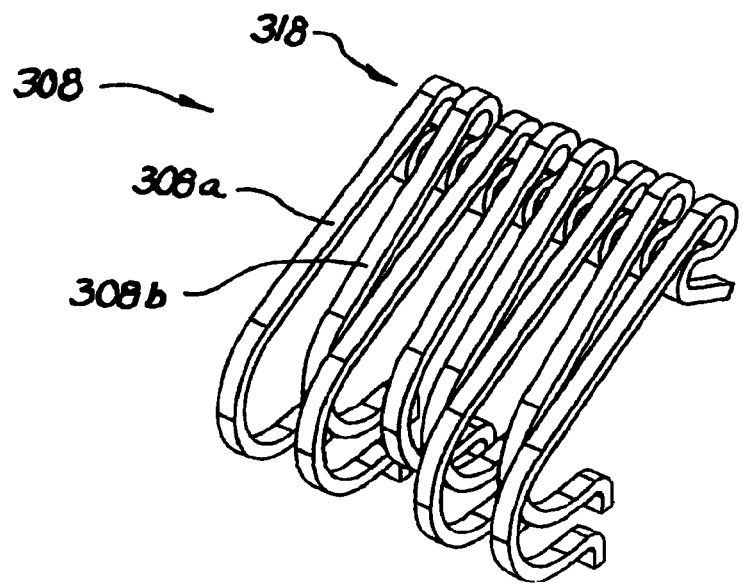
FIG. 43 is a perspective view of the contacts, including spring contacts.
Figure 44:
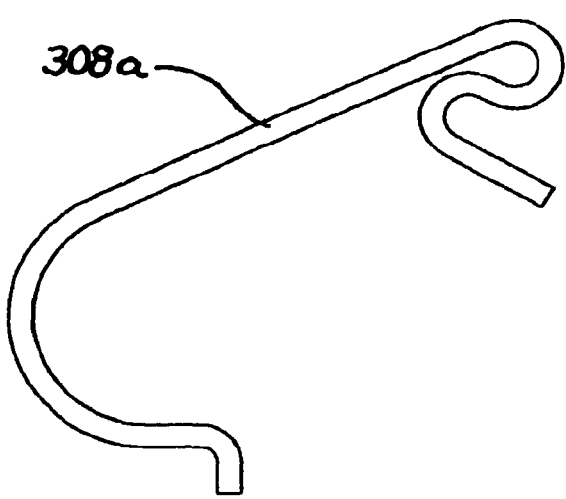
FIG. 44 is a perspective view of a long contact.
Figure 45:
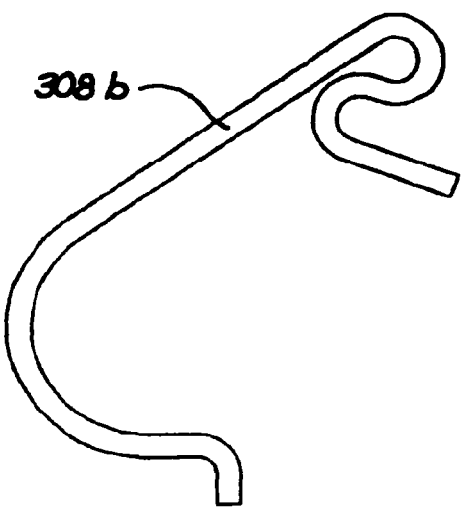
FIG. 45 is a perspective view of a short contact.

FIGS. 33-45 are various views of an illustrative embodiment of the present invention, in which alternating-length contacts include integral spring clips for connecting to a flexible printed circuit (FPC). FIGS. 33-35 are side cutaway views of a portion of such a jack. FIGS. 36 and 39 are exploded perspective views of a complete jack. FIGS. 37, 38, and 40-42 are detailed perspective views of components of the jack. FIGS. 43-45 show details of the jack contacts (also known as plug interface contacts).

The jack 300 includes a housing 302 that includes an integral front comb 304 and "sandwich-style" contact mounts 306 to hold and position a plurality of contacts 308. The front comb 304 limits the upward travel of the contacts 308. Each of the contacts 308 has a corresponding rear contact guide 310 into which the contacts 308 may travel upon insertion of a plug (not shown) into the jack 300. A FPC 312 is electrically and mechanically connected at one end to a printed circuit board (PCB) 314, which further connects to IDCs 316 that connect to a network cable (not shown). A second end of the FPC 312 is connected to the contacts 308 by a plurality of spring contacts 318. Each of the spring contacts 318 is preferably s-shaped to securely hold the FPC 312 so that a good electrical connection is maintained between the contacts 308 and the FPC 312. The jack further includes a bottom mounting plate 320 for mounting a front sled (around which contacts 308 are placed) in the housing 302. A rear sled 324 mechanically connects the housing (and components housed therein) to a wire cap 326 designed to accept a network cable for placement of individual wires (not shown) in the IDCs 316. In the particular wire cap 326 shown, a strain relief clip 328 securely holds the network cable in place, lessening strain on the individual wires within the network cable. The particular arrangement of the rear sled 324, wire cap 326, and strain relief clip 328 is shown as an example only. Many other designs could also be used, including those for a punch-down jack.

An advantageous feature of the jack 300 described with reference to FIGS. 33-45 is the use of contacts 308 having alternating lengths. As shown in FIGS. 43-45, half of the contacts 308a are longer in length than the other half 308b. While the spring contacts 318 on each contact 308 are aligned with one another, the lower portions that wrap around the front sled 322 for mounting in the contact mounts 306 substantially alternate from one end of the front sled 322 to the other. The middle two contacts 308 are the only two neighboring contacts 308 that have the same length, in the preferred embodiment. The difference in length between neighboring contacts 308a and 308b results in the contacts 308a and 308b being situated at different locations in relation to one another. This, in turn, reduces the capacitive couplings between contact pairs, which reduces crosstalk. To accommodate the different contacts 308a and 308b, the front comb 304 and front sled 322 are designed for both lengths of contacts.

Another feature of the design of contacts 308 is that those corresponding to wires 1 and 8 (the outside contacts) are both of the longer length. This helps to accommodate both 8-position plugs (in which contacts 1 and 8 make electrical connection with corresponding contacts in the plug) and 6-position plugs (in which contacts 1 and 8 are pushed down by a solid plastic portion that is common on most 6-position plugs). See FIG. 34 for an illustration of contact 1 or 8 with a 6-position plug inserted.

The spring contacts 308 provide an alternative FPC connecting mechanism to that described in other embodiments set forth herein (i.e. welding, etc.). During manufacture (or installation) the FPC 312 may be inserted into some or all of the spring contacts 318. The spring contacts 318 provide a holding force that pinches the FPC to hold it in place to allow a good electrical connection.

The disclosed invention provides an electrical connector employing crosstalk-reduction techniques. It should be noted that the above-described and illustrated embodiments and preferred embodiments of the invention are not an exhaustive listing of the forms such the invention might take; rather, they serve as exemplary and illustrative embodiments of the invention as presently understood. By way of example, and without limitation, the jack 110 of FIGS. 18-22 may be manufactured with a forward bend in the FPC 114, similar to the forward bend 34 shown in FIG. 5.

The invention claimed is:

1. A method of compensating for crosstalk in a modular communication connector comprising a plug and a jack, the jack comprising a plurality of jack contacts and a plurality of insulation displacement connectors (IDCs) configured to connect to wires of a cable, each jack contact having an interface at which the plug, when inserted into the jack, contacts the jack contact, the method comprising:

connecting a flexible printed circuit (FPC) to the jack contacts such that a first end of the FPC is connected to each jack contact approximately adjacent to and on an opposite side from the interface; and connecting a second end of the FPC to the IDCs, the FPC providing a network path for at least two conductor pairs between the jack contacts and the IDCs.

2. The method of claim 1, further comprising attaching the second end of the FPC to a rigid printed circuit board.

3. The method of claim 1, wherein:
the network path comprises conductive traces that provide crosstalk compensation and include a Near End (NEXT) compensation zone, a Near End (NEXT) crosstalk zone, a first transition zone between the jack contacts and the NEXT crosstalk zone, and a second transition zone between the NEXT compensation zone and the NEXT crosstalk zone, and
at a first frequency the NEXT crosstalk zone has an associated magnitude of total crosstalk coupling that is approximately equal to that of a specification plug and the NEXT compensation zone has an associated magnitude of total compensation coupling that is slightly less than twice that of a specification plug plus that of the first and second the transition zones.

4. The method of claim 3, wherein the NEXT compensation zone, the NEXT crosstalk zone, and the first and second transition zones each have distributed couplings and substantially no remote couplings.

5. The method of claim 4, wherein at a first frequency, a first phase angle change between an effective center of couplings of an installed specification plug and a center of the NEXT compensation zone is approximately equal to a second phase angle change between a center of the NEXT crosstalk zone and a center of the NEXT compensation zone.

* * * * *